US010982390B2

(12) United States Patent
Hu et al.

(10) Patent No.: US 10,982,390 B2
(45) Date of Patent: Apr. 20, 2021

(54) SCALABLE, HIGHLY TRANSPARENT PAPER WITH MICROSIZED FIBER

(71) Applicant: UNIVERSITY OF MARYLAND, COLLEGE PARK, College Park, MD (US)

(72) Inventors: Liangbing Hu, Rockville, MD (US); Zhiqiang Fang, Hyattsville, MD (US); Hongli Zhu, College Park, MD (US)

(73) Assignee: University of Maryland, College Park, College Park, MD (US)

(*) Notice: Subject to any disclaimer, the term of this patent is extended or adjusted under 35 U.S.C. 154(b) by 0 days.

(21) Appl. No.: 16/374,534

(22) Filed: Apr. 3, 2019

(65) Prior Publication Data

US 2019/0292728 A1    Sep. 26, 2019

Related U.S. Application Data

(63) Continuation of application No. 14/563,387, filed on Dec. 8, 2014, now abandoned.
(Continued)

(51) Int. Cl.
*D21H 17/07* (2006.01)
*D21H 17/66* (2006.01)
(Continued)

(52) U.S. Cl.
CPC ............. *D21H 17/07* (2013.01); *D21H 17/66* (2013.01); *H01L 31/02168* (2013.01);
(Continued)

(58) Field of Classification Search
None
See application file for complete search history.

(56) References Cited

U.S. PATENT DOCUMENTS 5,795,377 A * 8/1998 Tanner .................. C04B 18/243
106/164.4
6,379,494 B1    4/2002 Jewell et al.
(Continued)

FOREIGN PATENT DOCUMENTS

EP    2216345 A1    8/2010
EP    2402504 A1    1/2012
(Continued)

OTHER PUBLICATIONS

Ono H. et al., Cellulose Containing Resin Composite, May 8, 2008, machine translation of JP2008-106152 (Year: 2008).*
(Continued)

*Primary Examiner* — Chinessa T. Golden
(74) *Attorney, Agent, or Firm* — Klarquist Sparkman, LLP

(57) ABSTRACT

Solar cell substrates require high optical transparency, but also prefer high optical haze to increase the light scattering and consequently the absorption in the active materials. Unfortunately there is a tradeoff between these optical properties, which is exemplified by common transparent paper substrates exhibiting a transparency of about 90% yet a low optical haze (<20%). In this work we introduce a novel transparent paper made of wood fibers that display both ultra-high optical transparency (~96%) and ultra-high haze (~60%), thus delivering an optimal substrate design for solar cell devices. Compared to previously demonstrated nanopaper composed of wood-based cellulose nanofibers, our novel transparent paper has better dual performance in transmittance and haze, but also is fabricated at a much lower cost. This high-performance, low-cost transparent paper is a potentially revolutionary material that may influence a new generation of environmentally friendly printed electronics.

19 Claims, 28 Drawing Sheets

Related U.S. Application Data

(60) Provisional application No. 61/912,923, filed on Dec. 6, 2013.

(51) Int. Cl.
*H01L 31/04* (2014.01)
*H01L 31/0216* (2014.01)
*H01L 31/048* (2014.01)
*H01L 51/00* (2006.01)
*H01L 51/44* (2006.01)

(52) U.S. Cl.
CPC ............ *H01L 31/04* (2013.01); *H01L 31/048* (2013.01); *H01L 51/0097* (2013.01); *H01L 51/44* (2013.01); *Y02B 10/10* (2013.01)

(56) References Cited

U.S. PATENT DOCUMENTS

| | | |
|---|---|---|
| 2003/0111193 A1 | 6/2003 | Ko et al. |
| 2010/0065236 A1 | 3/2010 | Henriksson et al. |
| 2010/0173146 A1 | 7/2010 | Ihara et al. |
| 2013/0005869 A1 | 1/2013 | Yano et al. |
| 2013/0296544 A1 | 11/2013 | Isogai et al. |

FOREIGN PATENT DOCUMENTS

| | | | |
|---|---|---|---|
| JP | 2008-106152 A | | 5/2008 |
| JP | 2008106152 A | * | 5/2008 |
| WO | WO 2012/134378 A1 | | 10/2012 |

OTHER PUBLICATIONS

Boensch et al., "Transparent paper contains fibrous materials," Machine translation of EP 2402504 A1, Jan. 4, 2012.

Galland et al., "Cellulose nanofibers decorated with magnetic nanoparticles—synthesis, structure and use in magnetized high toughness membranes for a prototype loudspeaker," *Journal of Materials Chemistry C*, 2013, 1: pp. 7963-7972.

Gao et al., "Cellulose nanofibers/reduced graphene oxide flexible transparent conductive paper," *Carbohydrate Polymers*, 2013, 97: pp. 243-251.

Henriksson et al., "Cellulose nanopaper structures of high toughness," *Biomacromolecules*, 2008, 9: pp. 1579-1585.

Nakagaito et al., "Production of microfibrillated cellulose (MFC)-reinforced polylactic acid (PLA) nanocomposites from sheets obtained by a papermaking-like process," *Composites Science and Technology*, 2009, 69: pp. 1293-1297.

Nogi et al., "Optically transparent nanofiber paper," *Advanced Materials*, 2009, 21: pp. 1595-1598.

Ono et al., "Cellulose-containing resin composite," Machine translation of JP 2008-106152 A, May 8, 2008.

Petkewich, Rachel A., "Clear nanofiber paper," *Chemical & Engineering News*, Mar. 30, 2009, 87(13): p. 9.

Sehaqui et al., "Fast preparation procedure for large, flat cellulose and cellulose/inorganic nanopaper structures," *Biomacromolecules*, 2010, 11: pp. 2195-2198.

\* cited by examiner

Regular paper

Our transparent paper

Cellulose

TEMPO-oxidized Cellulose

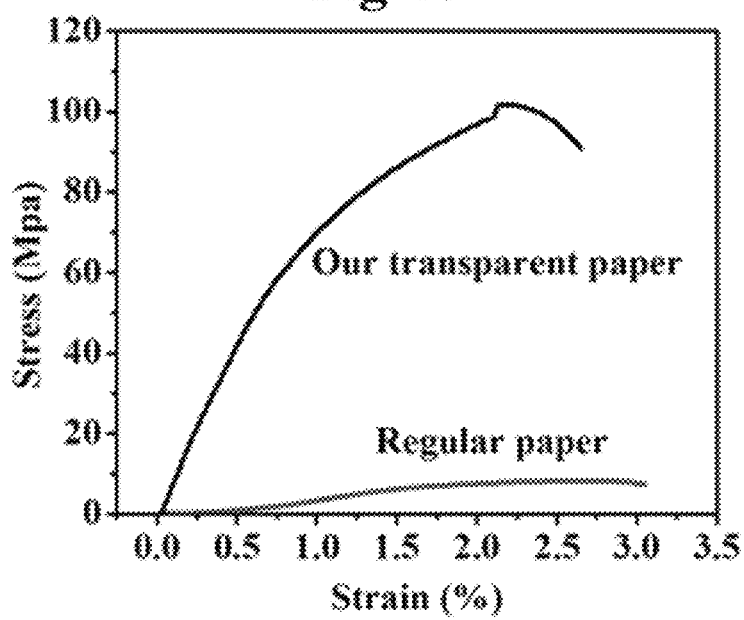
Fig 4c
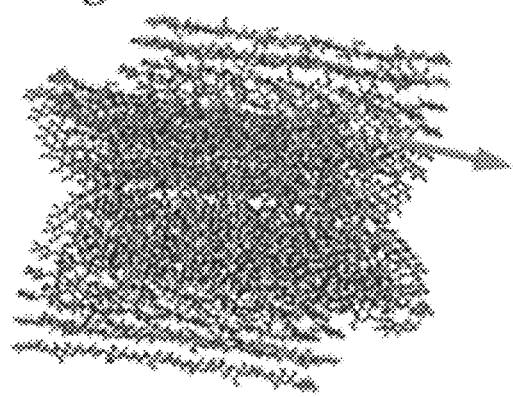
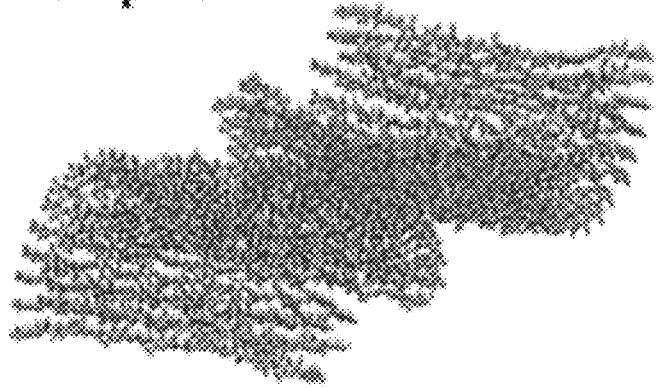
Fig 4d
Original wood fiber 1    Snapshot 1
Original wood fiber 2

TEMPO-oxidized fiber 1     Snapshot 2

TEMPO-oxidized fiber 2

Original cellulose fiber 1

Original cellulose fiber 2

TEMPO-oxidized cellulose flake 1

TEMPO-oxidized cellulose flake 2

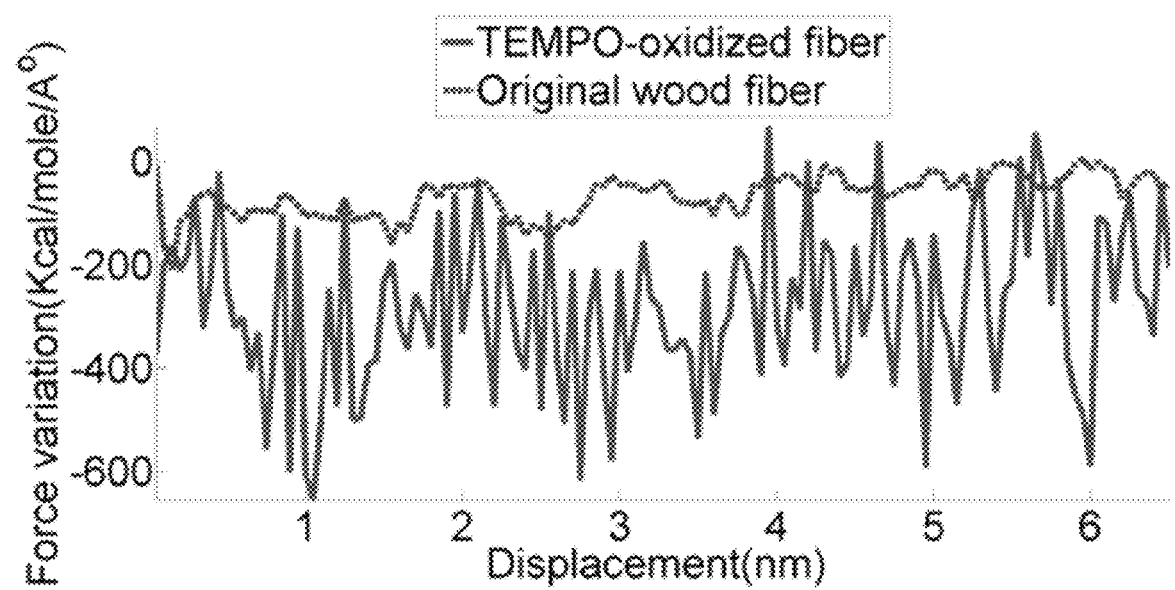

SCALABLE, HIGHLY TRANSPARENT PAPER WITH MICROSIZED FIBER

CROSS-REFERENCE TO RELATED APPLICATIONS

This application claims the benefit of U.S. Provisional Application Ser. No. 61/912,923 filed Dec. 6, 2013, the entire contents of which are incorporated herein by reference.

GRANT INFORMATION

This invention was made with government support under Grant No. FA95501310143 awarded by AFOSR. The United States government has certain rights in the invention.

BACKGROUND

Traditional ways to produce transparent paper involve fiber-based and sheet processing techniques. Fiber-based methods use overbeaten wood pulp, while sheet processing requires coating, impregnating, supercalendering, or chemical immersion to produce transparent paper. These methods consume large amounts of energy or rely on petroleum-based materials to produce paper with no more than 80% transmittance. Since Herrick and Turbak successfully separated nanofibers from wood pulp using a mechanical process in a high pressure homogenizer in 1983, cellulose nanofibers have attracted great attention because they can be used to manufacture transparent paper for printed electronics, optoelectronic devices, and also for packaging. Related art transparent paper is made of NFCs (nanofibrillated cellulose) which involves a fabrication process that is too time and energy consuming to be practical for commercial applications.

Some related art techniques are used to liberate nanofibers. These techniques include mechanical treatments and acid hydrolysis. Mechanical treatment techniques are currently considered efficient ways to isolate nanofibers from the cell wall of a wood fiber. However, solely mechanical processes consume large amounts of energy and insufficiently liberate the nanofibers while damaging the microfibril structures in the process. Pretreatments, therefore, are conducted before conducting mechanical disintegration in order to effectively separate the fibers and minimize the damage to the nanofiber structures.

TEMPO-mediated oxidation is proven to be an efficient way to weaken the interfibrillar hydrogen bonds that facilitate the disintegration of wood fibers into individualized nanofibers yet maintain a high yield of solid material. Nanopaper made of nanofibers can attain a transmittance of over 80%, yet this type of transparent paper takes a longer time to fabricate and has a very low haze.

Solar cell substrates require high optical transparency, but also prefer high optical haze to increase the light scattering and consequently the absorption in the active materials. Common transparent paper substrates generally possess only one of these optical properties, which is exemplified by common transparent paper substrates exhibiting a transparency of about 90% yet a low optical haze of <20%.

Substrates play a key role as to the foundation for optoelectronic devices. Mechanical strength, optical transparency, and maximum processing temperature, are among the critical properties of these substrates that determine its eligibility for various applications. The optoelectronic device industry predominantly utilizes glass substrates and plastic substrates for flexible electronics; however, recent reports demonstrate transparent nanopaper based on renewable cellulose nanofibers that may replace plastic substrates in many electronic and optoelectronic devices. Nanopaper is entirely more environmentally friendly than plastic substrates due to its composition of natural materials; meanwhile it introduces new functionalities due to NFCs' fibrous structure.

The maximum transparency among all current reports on glass, plastic, and nanopaper substrates is about 90%, but with a very low optical haze (<20%). Optical haze quantifies the percent of the transmitted light that diffusely scatters, which is preferable in solar cell applications. Optical transparency and haze are inversely proportional values in various papers. Trace paper has a high optical haze of over 50%, but a transparency of less than 80%; whereas plastic has a transparency of about 90%, but with an optical haze of less than 1%. Related art Nanopaper based on NFCs has the highest reported optical haze among transparent substrates due to its nanoporous structure, yet it is still a relatively low value.

Although optical haze is a property preferably maximized in transparent substrates integrated into solar devices, other optoelectronic devices require different levels of light scattering; for example, displays and touch screens need high clarity and low optical haze. Current commercial substrates are best suited for displays, but are not optimized for solar cell devices because of the low optical haze. Various materials such as $SiO_2$ nanoparticles or silver nanowires are reported to effectively increase light absorption and consequentially the short-circuit current by enhancing the path of light through the active solar layer with increased diffuse light scattering. The light scattering induced by these nanostructures is limited, however, and incorporating these materials requires additional steps that add cost to the solar cells devices.

There is a need in the market for a paper with high transparency and high optical haze.

SUMMARY OF THE INVENTION

The inventors of the present application have developed a method of making a transparent paper based on wood fibers, which has an ultra-high optical transparency (~96%) and simultaneously an ultra-high optical haze (~60%). The primary wood fibers are processed by using a TEMPO/NaBr/NaClO oxidization system to introduce carboxyl groups into the cellulose. This process weakens the hydrogen bonds between the cellulose fibrils, and causes the wood fibers to swell up and collapse resulting in a high packing density and excellent optical properties. The advantages of this invention is that it exhibits a dramatic dual improvement on the optical transmittance and optical haze; and it is formed from much less energy intensive processes that enable low cost paper devices. The optical properties allow a simple light-management strategy for improving solar cell performances. This is demonstrated with an organic solar cell by simply laminating a piece of such transparent paper, and observed its power conversion efficiency (PCE) increased from 5.34% to 5.88%. Transparent paper with an optical transmittance of ~96% and transmittance haze of ~60% is most suitable for solar cell applications.

BRIEF DESCRIPTION OF THE DRAWINGS

The above and/or other aspects of the present invention will be more apparent by describing in detail exemplary embodiments thereof, with reference to the accompanying drawings in which:

FIG. 4c shows a graph of the tensile strength of transparent paper according an embodiment of the invention and regular paper.

FIG. 4d shows MD simulation model of inter-sliding of two related art wood fibers.

FIG. 7d is μm.

FIG. 10c pulling force needed to drive the sliding as a function of relative sliding displacement for both cases.

DETAILED DESCRIPTION OF THE INVENTION

Figure 1A:
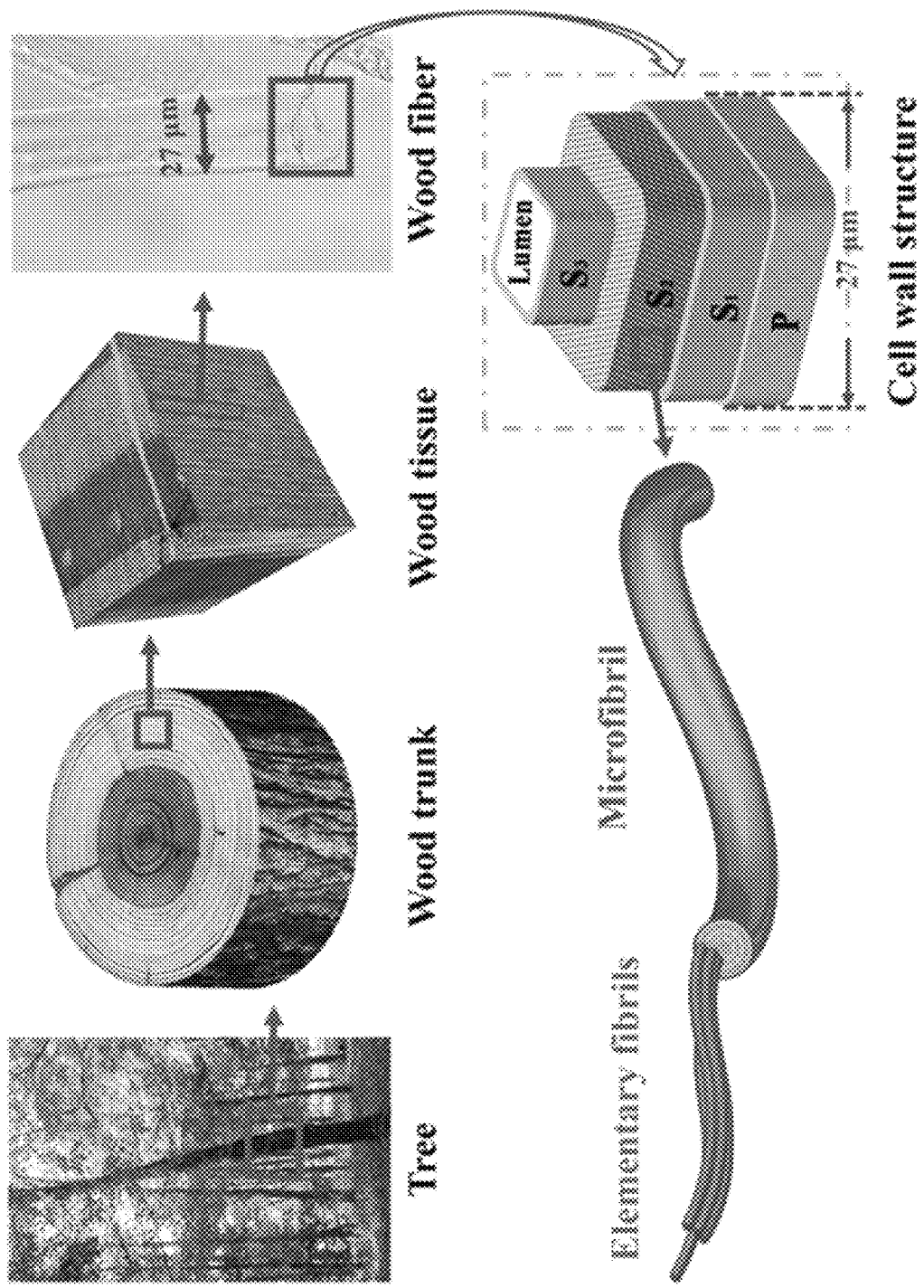
FIG. 1a shows a hierarchical structure of a tree and the conversion to elementary fibrils.
Figure 1B:
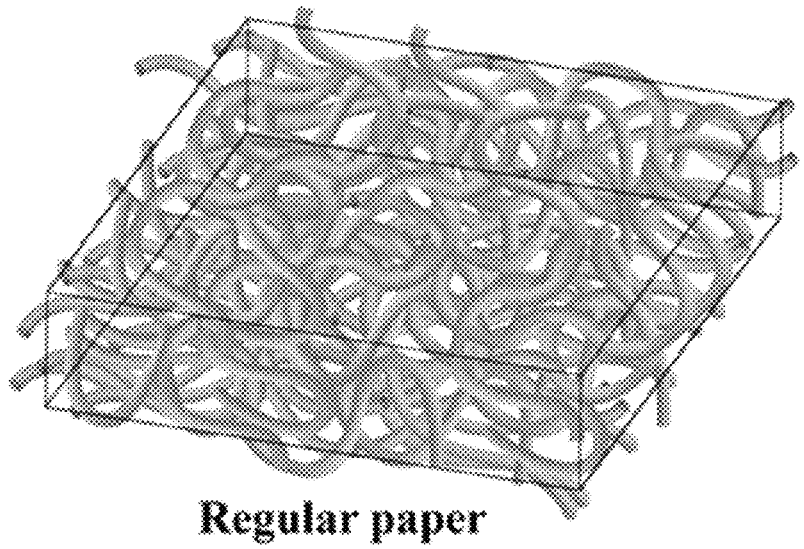
FIG. 1b shows a related art regular paper.

The invention relates to a method of making a transparent paper substrate made of earth-abundant wood fibers that simultaneously achieves an ultra-high transmittance (~96%) and ultra-high optical haze (~60%), and its optimal application on the solar cells with a PCE enhancement of 10% by a simple lamination process. The modified wood pulp with high fragment content and fewer hollow structures lead to a higher packing density, which dramatically increases both the optical transmittance and mechanical strength of our transparent paper compared to regular paper. The transparent paper demonstrates a much higher optical transmittance than nanopaper made of nanoscale fibers while using much less energy and time to process paper with a similar thickness. Such low-cost, highly transparent, and high haze paper can be utilized as an excellent film to enhance light-trapping properties for photovoltaic applications such as solar panel, solar roof, or solar windows. Transparent paper is made of mesoscale fibers. The primary fibers have an average diameter of ~26 μm.

The highly transparent paper has a high haze based on TEMPO-oxidized micro-sized wood fibers, plus an efficient and economic approach to improve the light absorption of a silicon slab is presented by applying a layer of TEMPO-treated wood fibers or by laminating a piece of highly transparent paper onto the surface. This approach to produce highly transparent paper with high haze using micro-sized wood fibers has the potential to be scaled up to industrial manufacturing levels, which is crucial for commercial applications. The wood fibers are processed by using a TEMPO/NaBr/NaClO oxidization system to introduce carboxyl groups into the C6 positions of the cellulose. This process weakens the bonds between the cellulose fibrils and causes the wood fibers to swell up. The oxidized wood fibers are then fabricated into highly transparent paper. The transparent paper requires less time to fabricate than nanopaper due to the use of micro-sized wood fibers, and it achieves both higher transmittance and higher haze. The treated wood fibers and fabricated transparent paper are applied on the surface of a silicon slab by coating and lamination, separately. A significant enhancement in the light absorption of a silicon slab is observed for both methods.

Wood fibers extracted from trees by chemical processes and mechanical treatments are the main building blocks of paper and consist of millions of microfibrils (nanofibers) with a diameter ranging from 5 nm to 20 nm mainly distributing in the S2 layer of cell wall. The primary wood fibers are processed by using a TEMPO/NaBr/NaClO oxidization system to introduce carboxyl groups into the cellulose.

Natural biomaterials are renewable and environmentally friendly materials that encourage the development of a sustainable human society. Cellulose is the most abundant renewable organic polymer on the earth that is primarily extracted from plants and composed of repeating anhydroglucose links through β-1, 4-glucosidic bonds. The TEMPO/NaBr/NaClO oxidation system weakens the hydrogen bonds between the cellulose fibrils, and causes the wood fibers to swell up and collapse resulting in a high packing density and excellent optical properties.

About 30-40 individual linear cellulose chains are assembled together into elementary fibrils 1.5-3.5 nm wide, and these elementary fibrils are hierarchically structured into a macroscopic structure, such as microfibrils (10-30 nm) or microfibrillar bands (~100 nm).[3] Microfibrillar bands are organized into the cell wall of wood fiber.[4] Wood fibers have a slender, hollow, and hierarchical structure that is approximately 10-50 lam wide and several millimeters long. These properties enable the paper to have its three dimensional structure, tailored optical properties, and tunable porosity. The structure of cellulose includes hydroxyl, ether, carbon-carbon, and carbon-hydrogen bonds that do not absorb light in the visible range;[2] consequently, pure cellulose is colorless. Although wood fibers consist of 85-95% cellulose after digesting and bleaching, the fibers' hollow structure prevents optical transparency due to light scattering that occurs in the interfacial area between the dense cell walls and the air present within the micro-sized cavities. Paper made of wood fibers also appears opaque due to the light scattering behavior from the porosity of the wood fiber network.

Transmission haze refers to the percentage of light diffusely scattered through a transparent surface from the total light transmitted. Higher transmission haze improves the light absorption efficiency of solar cells from the increased path of light transmitted into the active layer, resulting in an enhanced short circuit current density.

Optical haze quantifies the percent of the transmitted light that diffusely scatters, which is preferable in solar cell applications.

Figure 1C:
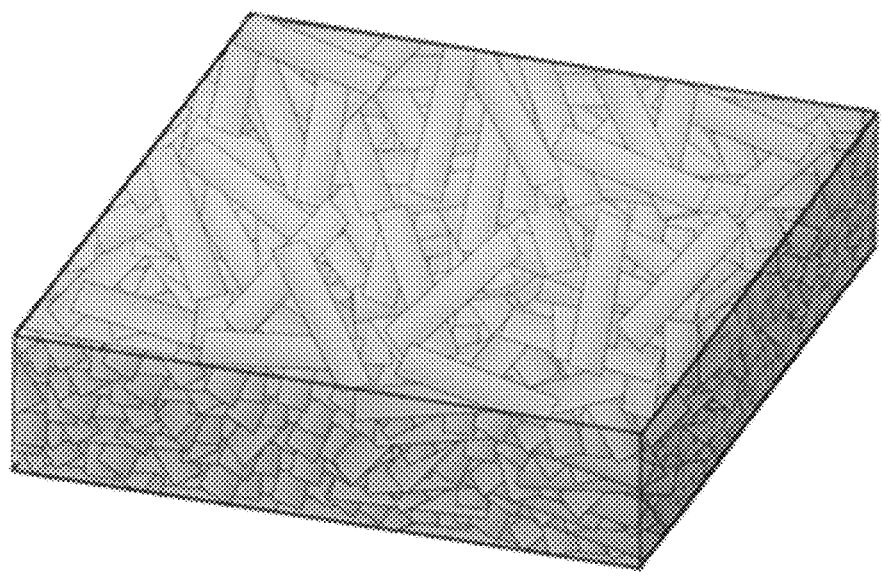
FIG. 1c shows transparent paper made of TEMPO-oxidized wood fibers.
Figure 1D:
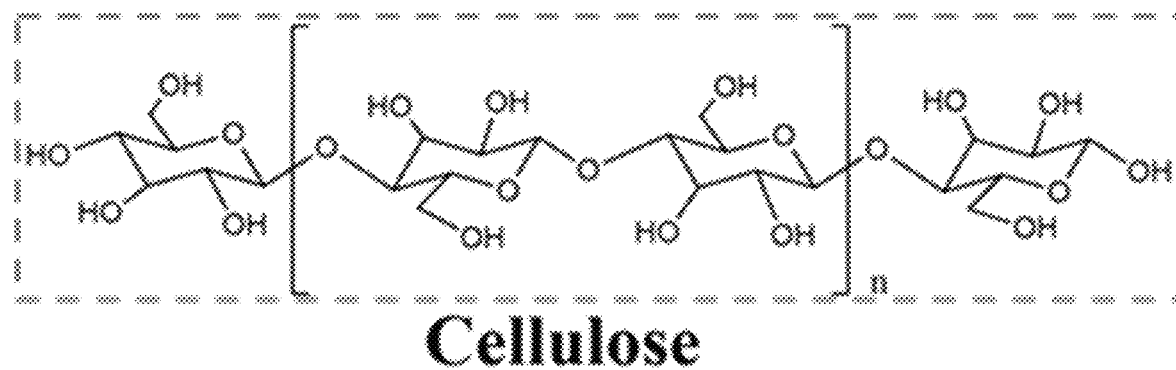
FIG. 1d shows molecular structure of cellulose.
Figure 1E:
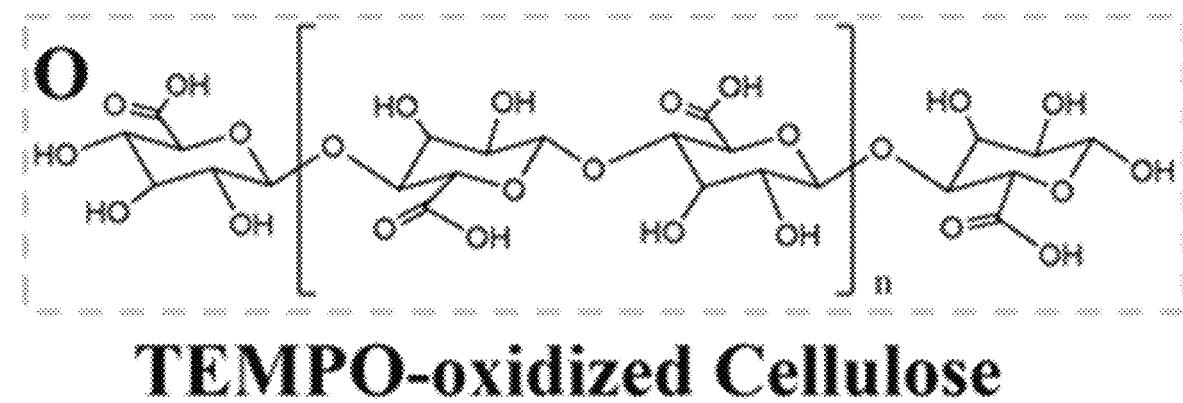
FIG. 1e shows TEMPO-oxidized cellulose with carboxyl groups in the C6 position.

FIG. 1a is a hierarchical structure of a tree. A schematic of cellulose and paper before and after TEMPO-mediated oxidation is portrayed. As shown in FIG. 1, the TEMPO/NaBr/NaClO system was used to modify the surface properties of the pristine wood fibers by selectively oxidizing the C6 hydroxyl groups of glucose (left bottom in FIG. 1b) into carboxyl groups under aqueous conditions (FIG. 1c). The repulsive force resulting from additional higher negative charges at the surface of the nanofibers loosens the interfibrillar hydrogen bonds between the cellulose nanofibers resulting in the fiber cell walls are significantly open and crush. Regular paper with micro-sized wood fibers has limited optical transparency due to the many micro-cavities existing within the porous structure that cause light scattering (top left in FIG. 1b). Eliminating these pores is the primary direction to improve the optical transmittance of paper. Many approaches based on the above mechanism are used to produce transparent paper involving fiber-based and sheet processing techniques. Regular paper is a porous structure composed of untreated wood fibers with an average width of ~27 μm (FIG. 1b); however paper made from TEMPO-oxidized wood fibers with an average width of approximately 26 μm displays a more densely packed configuration (top left FIG. 1c). The morphology of wood fibers plays a significant role in producing highly transparent paper, hence fiber morphological analysis of TEMPO-treated wood fibers was conducted for explaining the high packing density of transparent paper made from TEMPO-oxidized micro-sized wood fibers.

FIG. 2 portrays the morphology of original bleached sulfate wood fibers under an optical microscope. FIGS. 2a and 2b portray the significant morphological changes in the dimensions of the wood fibers before and after TEMPO treatment was conducted for 10 h at a stirring speed of 1000 rpm. Compared to the original fibers, the TEMPO-oxidized fibers swelled such that the width of the fibers expanded while the length decreased. FIGS. 2c and 8c indicate that most fibers are cleaved and unzipped in the axial direction, and the degree of polymerization of the cellulose decreases. FIGS. 2d and 8d show the configuration of cellulose nanofibers on the cell wall of wood fibers revealing portion of cellulose nanofiber were removed from the primary layer of cell wall during the TEMPO treatment due to weak interfibrillar hydrogen bonds. As seen in Table 1, the average length of the wood fibers dramatically decreased from 1.98 mm to 0.71 mm after the TEMPO treatment, and there was a slight reduction in the average width and an enormous increase in fines from 5.90% to 18.68%.

TABLE 1

Dimension of wood fibers before and after TEMPO oxidization

|  | Average length (mm) | Average width (μm) | Fine content (%) |
|---|---|---|---|
| Pristine fibers | 1.98 | 27.25 | 5.90 |
| TEMPO-oxidized fibers | 0.71 | 25.79 | 18.68 |

Figure 2A:
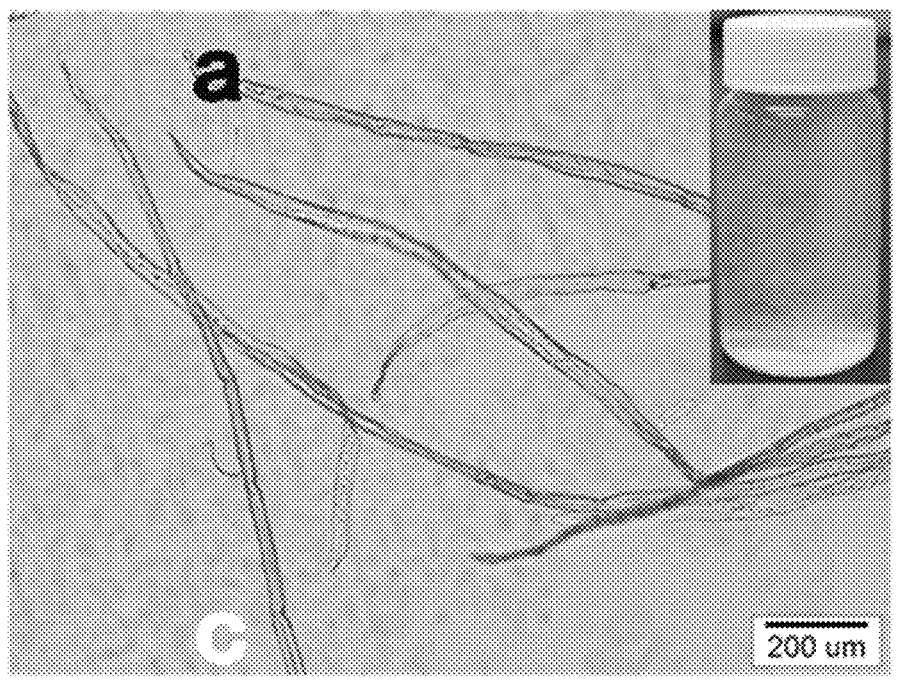
FIG. 2a shows the morphology of original bleached sulfate wood fibers under an optical microscope. The inset is a 0.25 wt % original bleached sulfate wood pulp suspension.
Figure 2B:
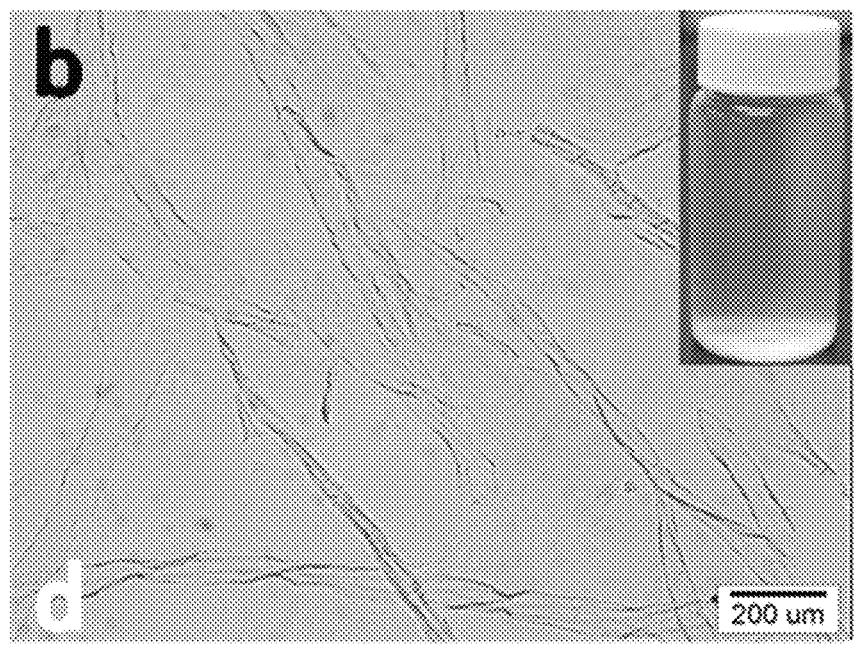
FIG. 2b shows the morphology of TEMPO-oxidized wood fibers under an optical microscope. Inset is a 0.25 wt % TEMPO-oxidized wood fiber suspension.
Figure 2C:
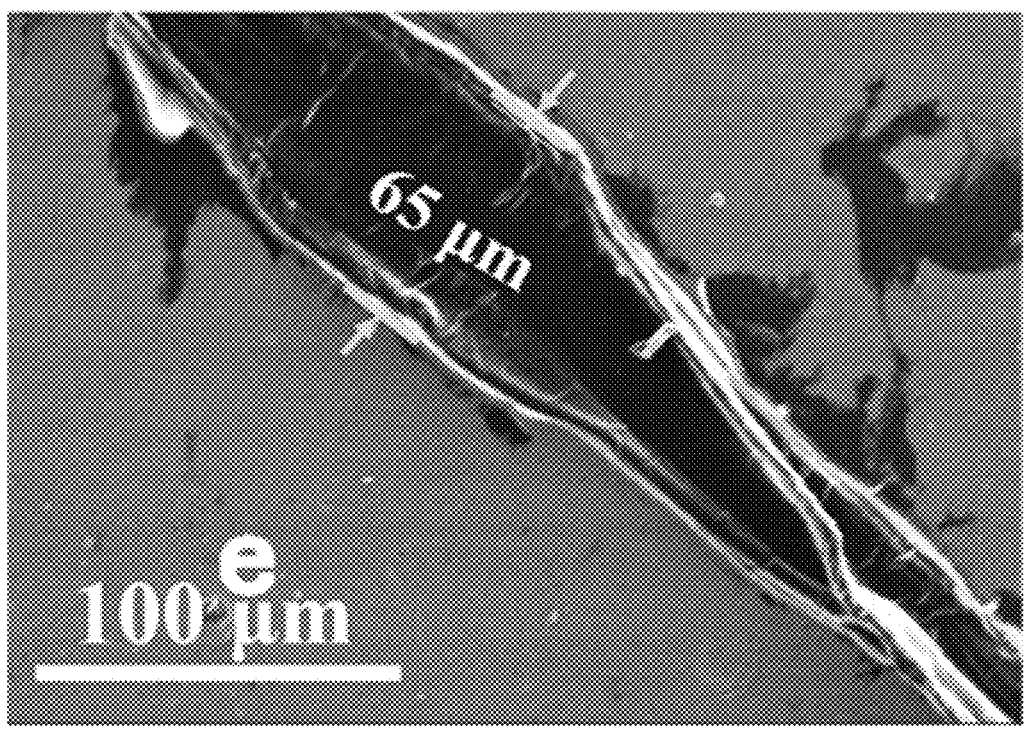
FIG. 2c shows SEM images of unzipped TEMPO-oxidized wood fibers.
Figure 2D:
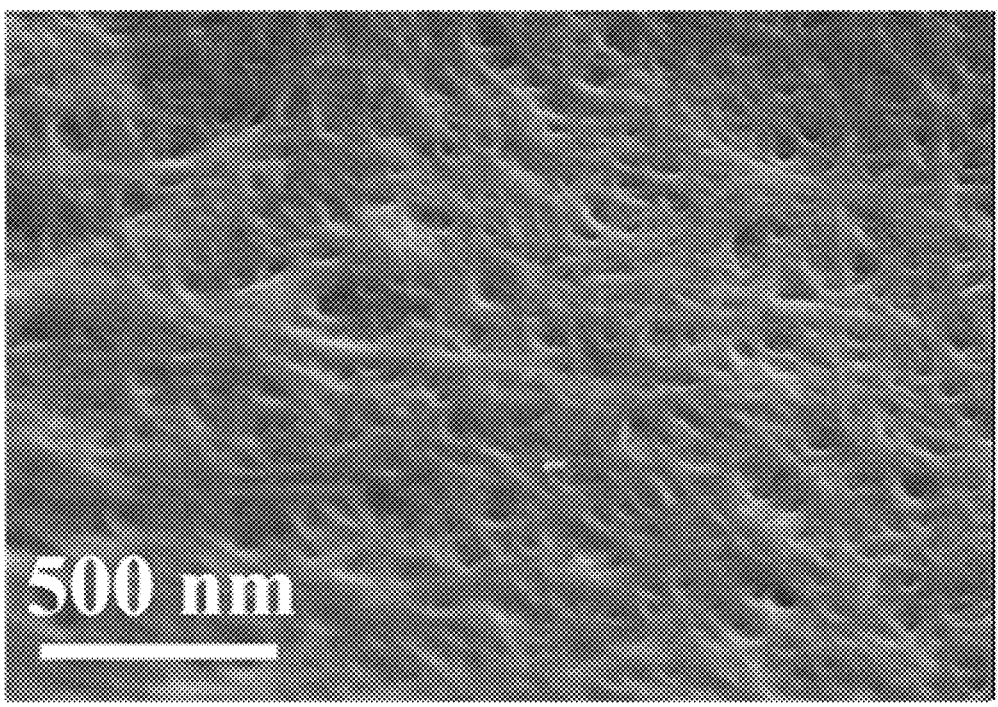
FIG. 2d shows nanofibers on the cell wall of TEMPO-oxidized wood fiber.
Figure 2E:
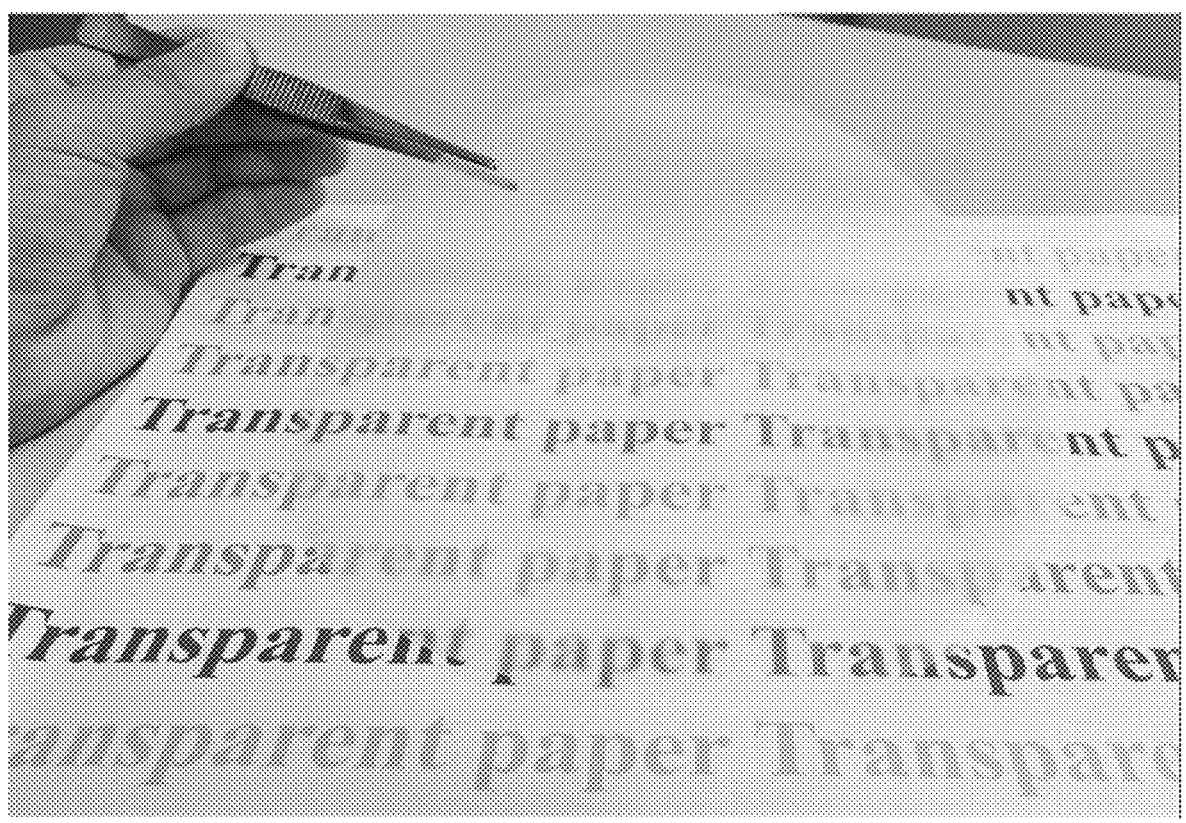
FIG. 2e shows a digital image of transparent paper produced from TEMPO-oxidized wood fibers with a diameter of 20 cm.

FIGS. 2a and 2b indicate how TEMPO-oxidized wood pulp with a concentration of 0.25% (by weight) shows a more homogeneous and transparent appearance than the original wood pulp with the same consistency. FIG. 2d shows how increased fines, reduced fiber lengths, and crushed and unzipped TEMPO-oxidized fibers tend to form denser fiber network during fabrication that perpetuates high optical transmittance. The "transparent paper" seen in FIG. 2e refers to paper produced from the TEMPO-oxidized wood fibers and it exhibits an excellent transmittance.

Table 1 portrays a highly transparent paper with high haze that was fabricated with obtained TEMPO-oxidized micro-sized wood fibers by vacuum filtration showing a considerable reduction of filtration time and energy.

Figure 3A:
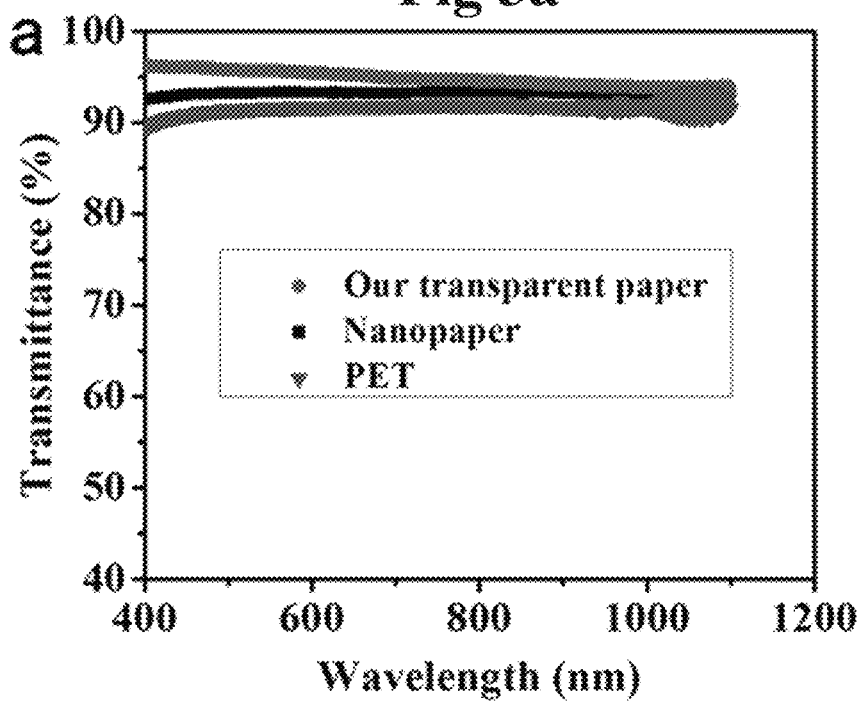
FIG. 3a shows a graph of the total optical transmittance vs. wavelength measured with an integrating sphere setup.

The filtration time for transparent paper with a thickness of 50 μm is generally less than 1 hour, however, it will take at least 8 hours to filter a piece of nanopaper with a similar thickness using 5~30 nm wide TEMPO-oxidized nanofibers under the same conditions. The total light transmittance of transparent paper, nanopaper, and PET (polyethylene terephthalate) is compared in FIG. 3a and the basic information of the two types of paper is shown in Table S1.

TABLE S1

Mass and thickness of paper

|  | Mass (g/m$^2$) | Thickness (μm) |
|---|---|---|
| Nanopaper | 33 | 32 |
| Transparent paper | 50 | 44 |

According to this data, transparent paper has the highest optical transmittance compared to nanopaper and PET.

FIG. 3 shows optical properties of our transparent paper, nanopaper, and PET. Highly transparent paper with high haze was fabricated with obtained TEMPO-oxidized micro-sized wood fibers by vacuum filtration showing a considerable reduction of filtration time and energy. The filtration time for transparent paper with a thickness of 50 μm is generally less than 1 hour, however, it will take at least 8 hours to filter a piece of nanopaper with a similar thickness using 5~30 nm wide TEMPO-oxidized nanofibers under the same conditions. The total light transmittance of transparent paper, nanopaper, and PET (polyethylene terephthalate) is compared in FIG. 3a and the basic information of the two types of paper is shown in Table S1.

According to this data, transparent paper has the highest optical transmittance compared to nanopaper and PET.

Figure 3B:
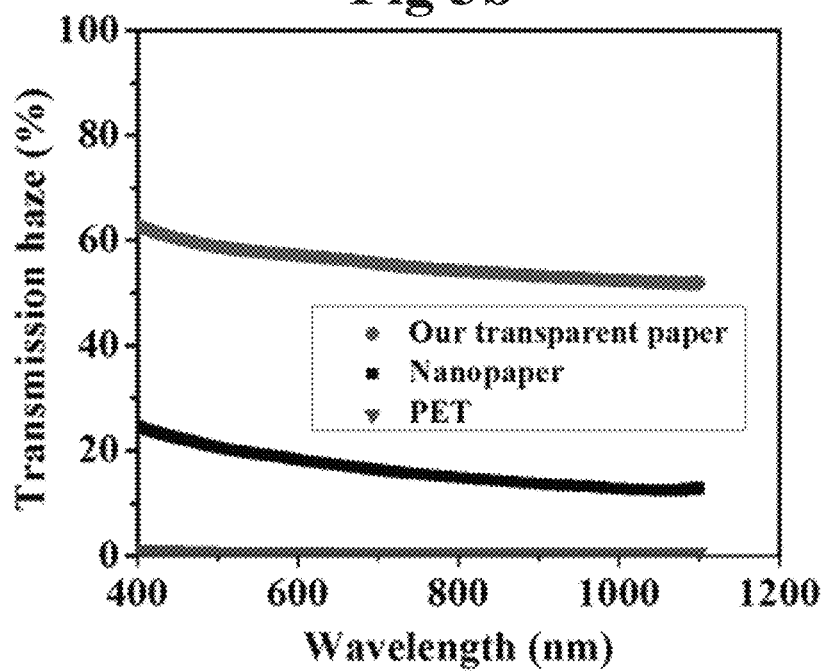
FIG. 3b shows a graph of the transmission haze vs. wavelength.

FIG. 3b depicts the wavelength vs. transmission haze as plotted. Transmission haze is an important optical property for optoelectronic devices, and refers to the percentage of light diffusely scattered through a transparent surface from the total light transmitted. For the transparent paper in this work, a transmission haze over 50% is demonstrated while maintaining a transmittance of over 90%. Additionally, the transmission haze and the optical transmittance of transparent paper are also determined by the paper thickness. Higher transmission haze improves the light absorption efficiency of solar cells from the increased path of light transmitted into the active layer, resulting in an enhanced short circuit current density.

Figure 3C:
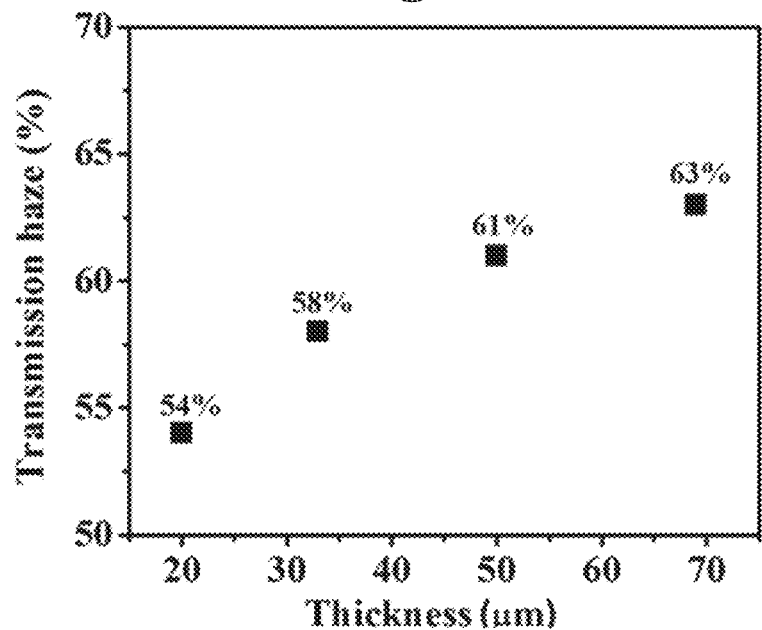
FIG. 3c shows the transmission haze of transparent paper with varying thicknesses at 550 nm.
Figure 9:
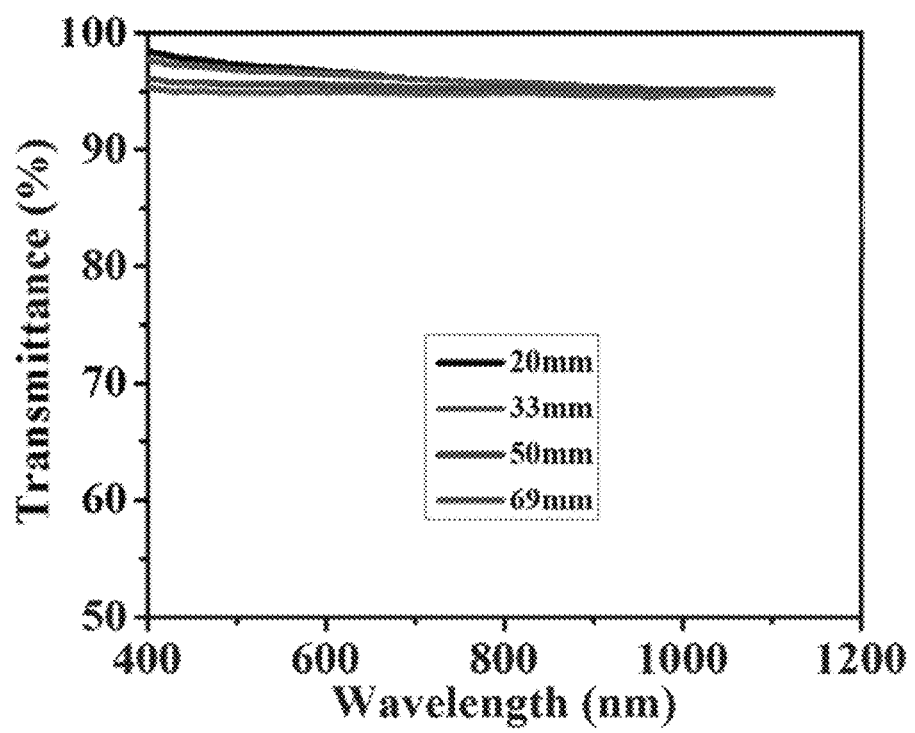
FIG. 9 shows the total optical transmittance of transparent paper with varying thicknesses.

FIG. 3c shows how the transmission haze tends to increase with an increase in paper thickness while the optical transmittance increases slightly with a decrease in paper thickness (FIG. 9 and Table S2).

TABLE S2

Mass and thickness of transparent paper with oxidized wood fibers

|  | Mass (g/m$^2$) | Thickness (μm) |
|---|---|---|
| 1 | 81 | 69 |
| 2 | 63 | 50 |
| 3 | 37 | 33 |
| 4 | 20 | 20 |

It is critical to combine the optical haze and transmittance for substrates toward different applications. The performance of optical transmittance vs. wavelength of substrates has been widely investigated; but the optical haze is largely ignored as most substrates have a much lower optical haze (<1%).

Figure 3D:
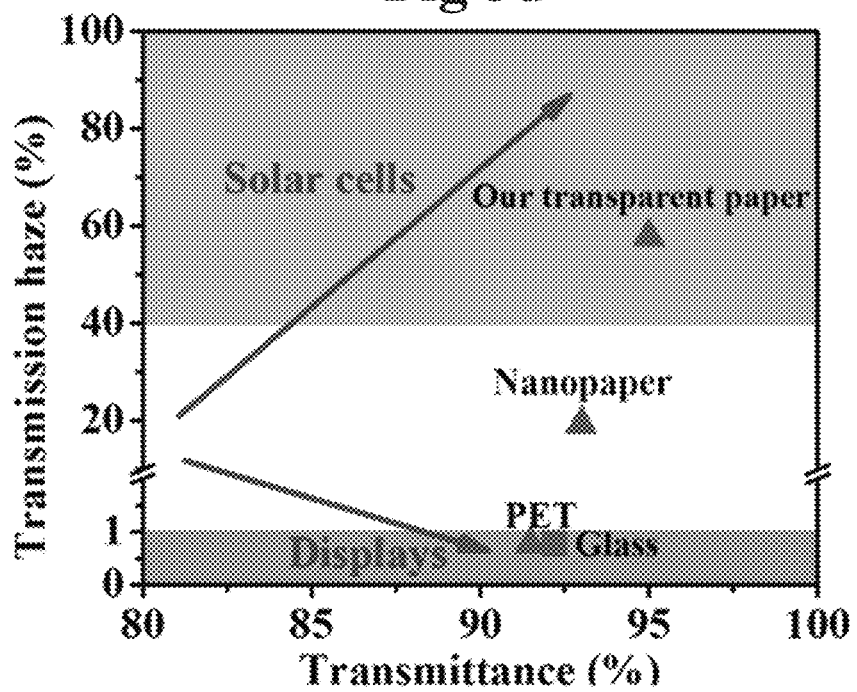
FIG. 3d shows optical transmission haze vs. transmittance for different substrates at 550 nm. Glass and PET plastics are in the green area, in which are suitable for displays due to their low haze and high transparency; transparent paper developed embodied by this invention are located in the cyan area is the most suitable for solar cells.

As shown in FIG. 3d, a high clarity for substrates is crucial for displays. Glass and plastic substrates all meet this requirement. Recently developed nanopaper has an optical haze of 15-20%, which is too high for display applications, but it is more suitable for solar cells. Note some outdoor displays also requires substrates with a high haze to avoid glare effect in sunlight. All these substrates have an optical transmittance of ~90%. Our transparent paper has an optical transmittance of ~96% and transmittance haze of ~60%, which is the most suitable substrate for solar cell applications.

Figure 4A:
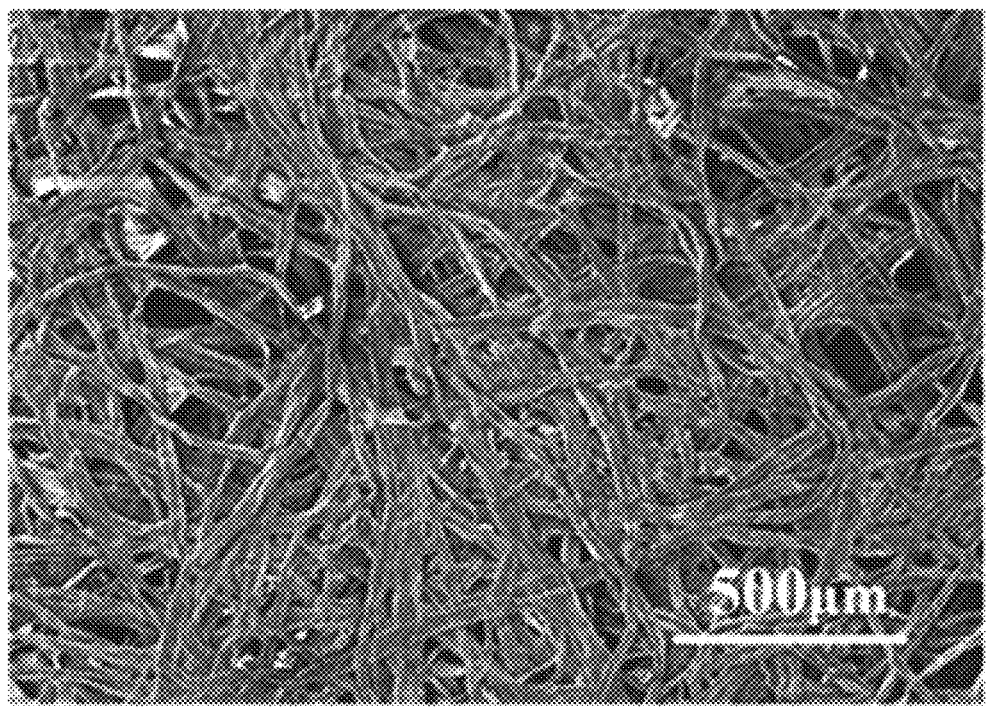
FIG. 4a shows an SEM image of a regular paper.
Figure 4B:
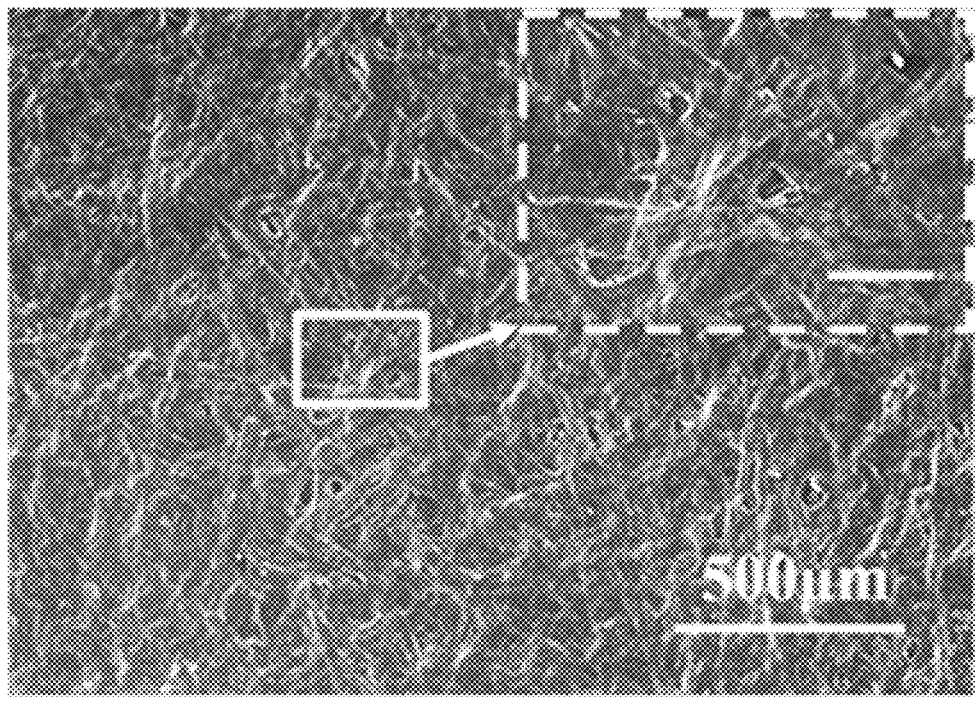
FIG. 4b shows an SEM image of a transparent paper.

FIGS. 4a and 4b show SEM images taken to study the morphology of regular paper and transparent paper. These images were taken to further explore why our transparent paper exhibit the highest transmittance. Although the cylindrical wood fibers within the regular paper collapse during pressing and drying, there are plenty of cavities that form throughout the network of micro-sized fibers causing enhanced light scattering behavior due to the refractive index mismatch between cellulose (1.5) and air (1.0). In FIG. 4b, a homogenous and more conformal surface is observed due to the collapse of the TEMPO-oxidized wood fibers. There is a significant amount of small fragments in the pulp that fill in the voids within the paper (see the inset in FIG. 4b). This causes less light scattering to occur within the TEMPO treated paper allowing more light to pass through it.

A possible explanation for the transparent paper demonstrating a higher optical transmittance than nanopaper could be that the cell wall of the wood fibers are comprised of a primary and secondary layer with thicknesses of approximately 0.1-0.2 μm and 1-5.5 μm, respectively. The microfibrils are randomly oriented in the primary layer whereas the microfibrils in the secondary layer are helically wound around the fiber axis (see FIG. 1a). Although oxidization effectively weakens the interfibrillar hydrogen bonds between the microfibrils and shortens the fiber length, it only happens within the non-crystalline region and/or on the crystal surfaces of the microfibrils. As a result, the parallel arrangement of microfibrils in the secondary layer is preserved within the cell wall of the wood fibers, giving rise to a higher stacking density (1.14 g/cm3) compared to nanopaper (1.03 g/cm3) made of randomly arranged microfibrils. Transparent paper made of micro-sized fibers, therefore, has better optical transmittance yet consumes much less energy and time for fabrication.

FIG. 4c compares the stress-strain curves of regular paper and transparent paper. The mechanical properties of paper (e.g., toughness, strength) are important for various applications. To test the mechanical properties of the paper, tensile tests of both the transparent paper TEMPO-oxidized wood fibers and regular paper were conducted using the Tinius Olsen H25KT universal testing machine. The comparison shows that the transparent paper is both much stronger (with a tensile strength of ~105 MPa) and much tougher (with a toughness of ~1.88 $J/M^3$) than the regular paper (with a tensile strength of ~8 MPa and a toughness of ~0.15 $J/M^3$).

Such substantial improvements of the mechanical properties of the transparent paper (~13-fold stronger and ~12-fold tougher) find their origin in the enhanced contact area in between nanoscale building blocks of the paper due to TEMPO-treatment, whose effect is twofold: unzipping and cleaving the originally hollow cellulose fibers not only exposes their inner surface to neighboring fibers, but also leads to ribbon-like cellulose flakes and fragments that facilitate higher packing density and more overlapping between neighboring fibers.

The rich hydroxyl groups of the cellulose surface allow facile formation of strong hydrogen bonds. The inter-cellulose-flake bonding in TEMPO-oxidized transparent paper is expected to be consequently much stronger than the inter-cellulose-fiber bonding in regular paper, the physical origin of the substantial improvements in both strength and toughness.

FIGS. 4d and 4e and FIG. 10a, 10b portray molecular dynamic (MD) simulations of scaled-down models for both TEMPO-oxidized fibers and original wood fibers with roughly comparable size. The simulation is based on simplified fiber with uniform dimension, but fiber morphology, fines content, kink index, pigments within paper are some properties that may impact the mechanical strength of paper. The inter-flake (and inter-fiber) sliding and the representative molecular-scale deformation mechanism that leads to the final mechanical failure of the paper were simulated.

Figure 4E:
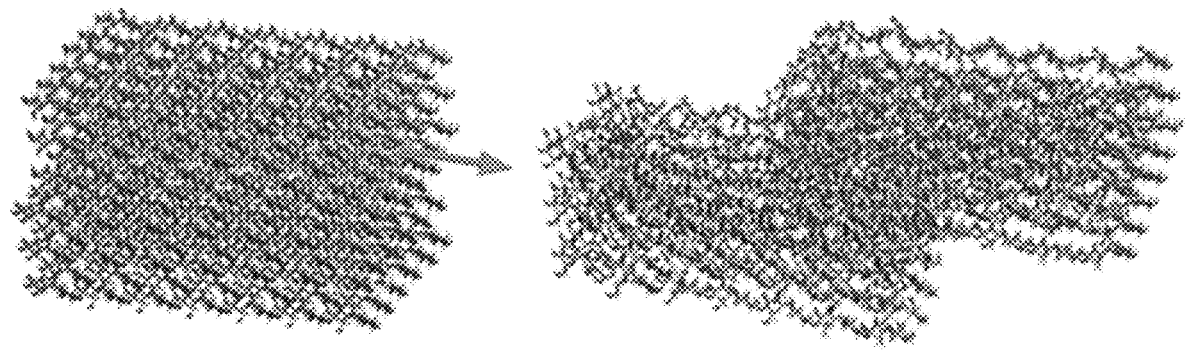
FIG. 4e shows MD simulation of two TEMPO-oxidized wood fibers.
Figure 4F:
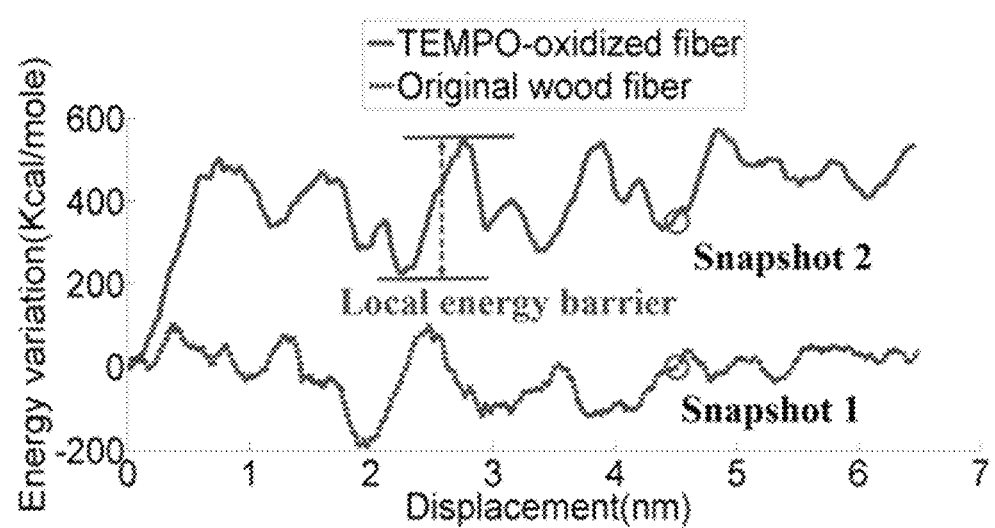
FIG. 4f shows a graph of variation of potential energy of the model systems as a function of relative sliding displacement for FIGS. 4d and e.

FIG. 4f compares the variation of potential energy as a function of sliding displacement for both cases. The zig-zag nature of the curve denotes the cascade stick-slip events due to breaking and reforming of hydrogen bonds in between two cellulose flakes (or fibers) under sliding displacement. The accumulated energy dissipation, calculated by the sum of all local energy barriers, represents the energy to fracture the neighboring flakes/fibers (i.e., toughness). Comparison in FIG. 4f reveals that the energy needed to separate two flat cellulose flakes is more than 14 times higher than that in the case of two cellulose fibers (~536 kcal/mol vs.~38 kcal/mol), which clearly explains the huge increase in fracture toughness due to TEMPO treatment.

FIG. 10c portrays the resultant force variation as a function of sliding displacement for both cases. The average pulling force necessary to slide the TEMPO-oxidized cellulose flakes (~~284 kcal/mol/Å) is much larger than that in the original cellulose fiber case (~66 kcal/mole/Å). Considering the effective reduction of the cross-sectional area from the hollow cellulose fibers to TEMPO-treated flat flakes, the mechanical strength of TEMPO-oxidized cellulose paper (largest force that can sustain divided per unit cross-section area) is expected to be even higher than that of regular paper, as revealed by the tensile test results.

Figure 5A:
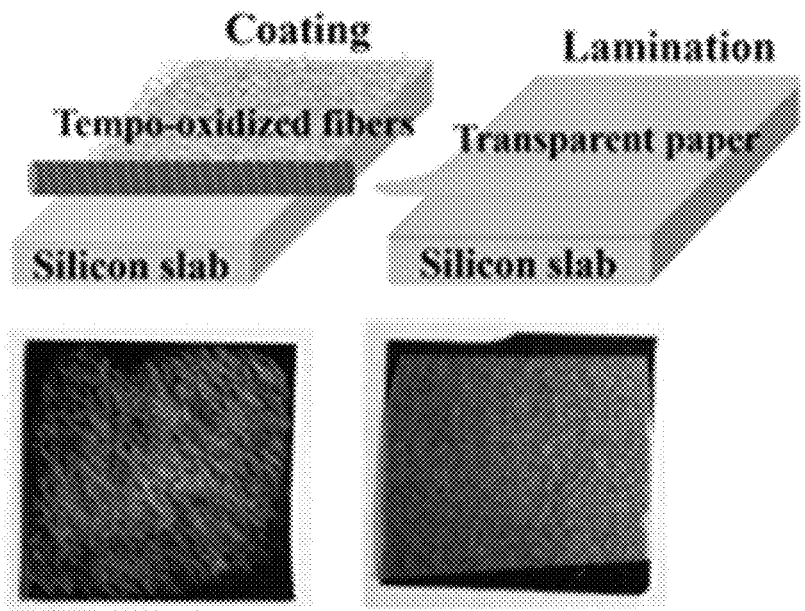
FIG. 5a shows schematics and images of cellulose-deposited silicon slab. Top left: a schematic structure of wood fibers deposited on a silicon slab by Meyer rod coating; top right: a schematic of a transparent paper attached silicon slab by lamination; bottom left: TEMPO-oxidized wood fibers deposited on a silicon slab; bottom right: transparent paper with a thickness of 33 μm attached on a silicon slab.

FIG. 5a shows schematics and images of cellulose-deposited silicon, where the left plots refer to the TEMPO-oxidized wood fiber deposited silicon, and the right diagrams represent transparent paper laminated silicon. Paper with ultra-high transmittance and high transmission haze has potential applications in optoelectronic devices. The light scattering effect of transparent paper can improve the path of light travelling through the active layers of thin film solar cells resulting in an enhanced light absorption. To verify the assumption, TEMPO-oxidized wood fibers are directly coated onto the surface of a silicon slab and transparent paper laminated onto the surface of silicon using NFC as a binder to analyze any resulting enhancement of light absorption in the silicon.

Figure 5B:
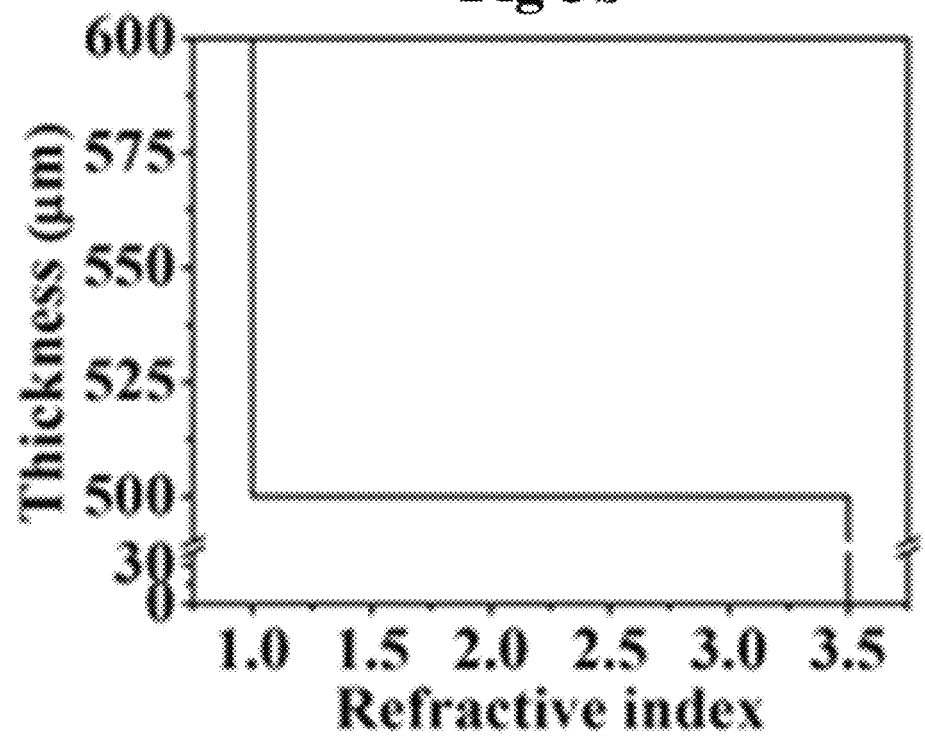
FIG. 5b shows the effective refractive index profiles of the interfaces between air and silicon slab.
Figure 5C:
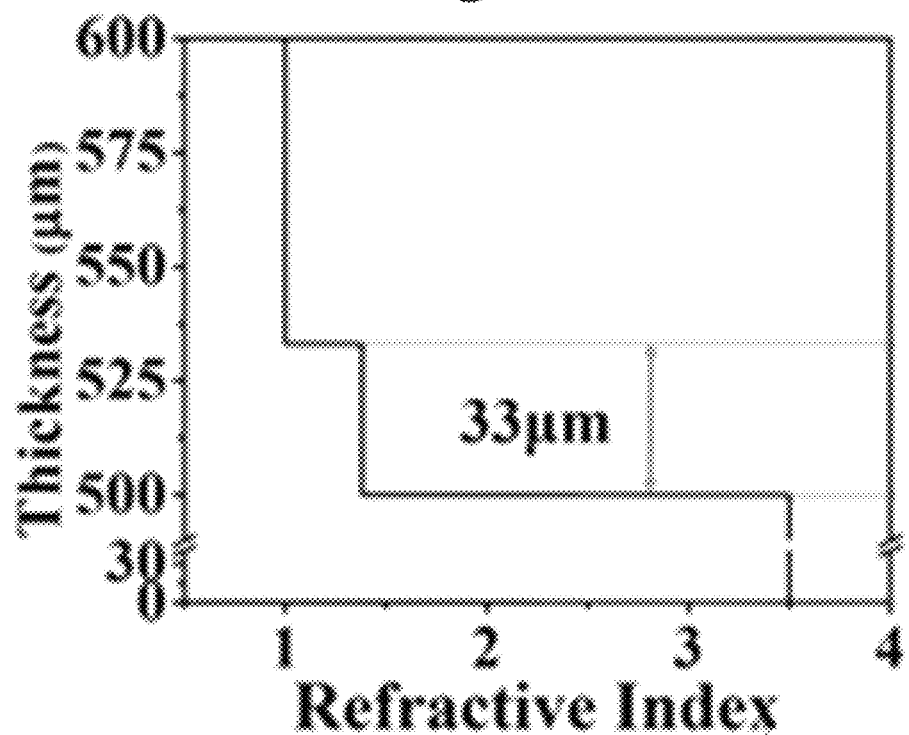
FIG. 5c shows the effective refractive index profiles of 33 μm cellulose-deposited on a silicon slab.
Figure 5D:
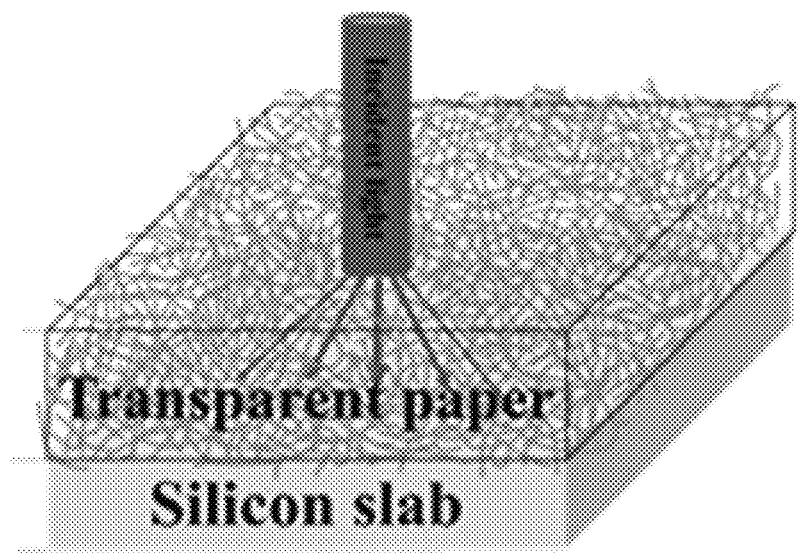
FIG. 5d shows a schematic diagram of transparent paper and its light scattering behavior.

There are three possible mechanisms to achieve increased light absorption in the active layer: (1) the index of transparent paper is between the values for the Si substrate and air, which can effectively decrease the index contrast and lower the reflection for light entering from air to Si (compare FIGS. 5b and 5c); (2) a large light forward scattering effect of transparent paper, which can increase the path length of light in the Si layer (as shown in FIG. 5d); (3) a ultra-high optical transparency, up to 96%, of our transparent paper. These effects make transparent paper fundamentally better than plastic substrates for thin film solar cells.

Figure 5E:
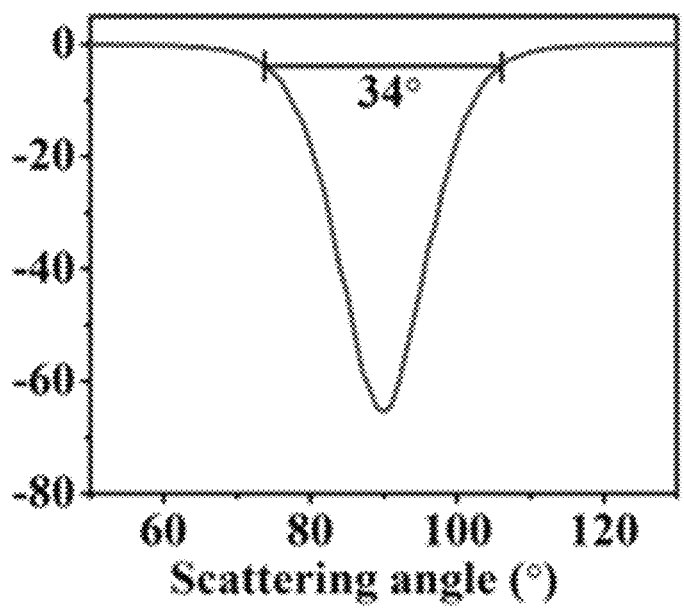
FIG. 5e shows a scattering angular distribution with an arbitrary y-axis unit for transparent paper, the maximum scattering angle is 34°.

As shown in the schematic FIG. 5d, the direct incident light is scattered as it propagates through the transparent paper, generating a high transmission haze. To quantitatively explain the light scattering effect of transparent paper, an optical setup consisting of a rotating light detector was applied to measure the angular distribution of transmitted light. Light passing through transparent paper exhibits high diffuse scattering with an expected inverse Gaussian-like pattern (FIG. 5e). The angle is defined whereas the incident light is perpendicular to the surface of transparent paper as 90° and the scattering angle range is defined as the transmitted light at angles with an intensity larger than 5% of the peak transmission intensity at 90°.

Figure 5F:
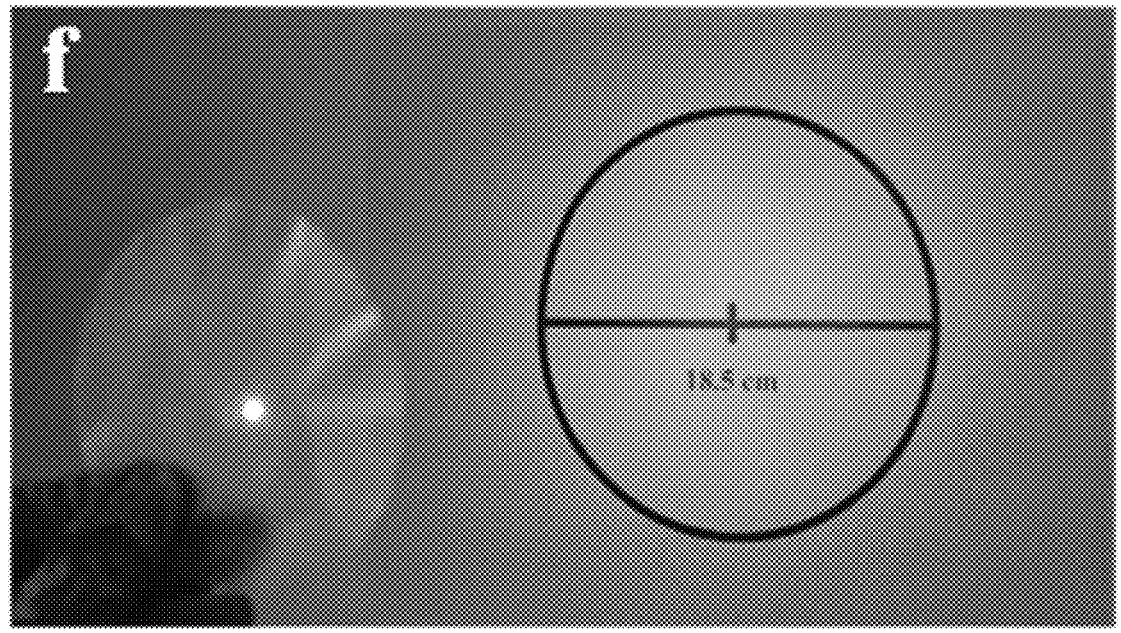
FIG. 5f shows a photo to show the light scattering effect of transparent paper when a laser with a diameter of 0.4 cm passes though transparent paper.
Figure 11:
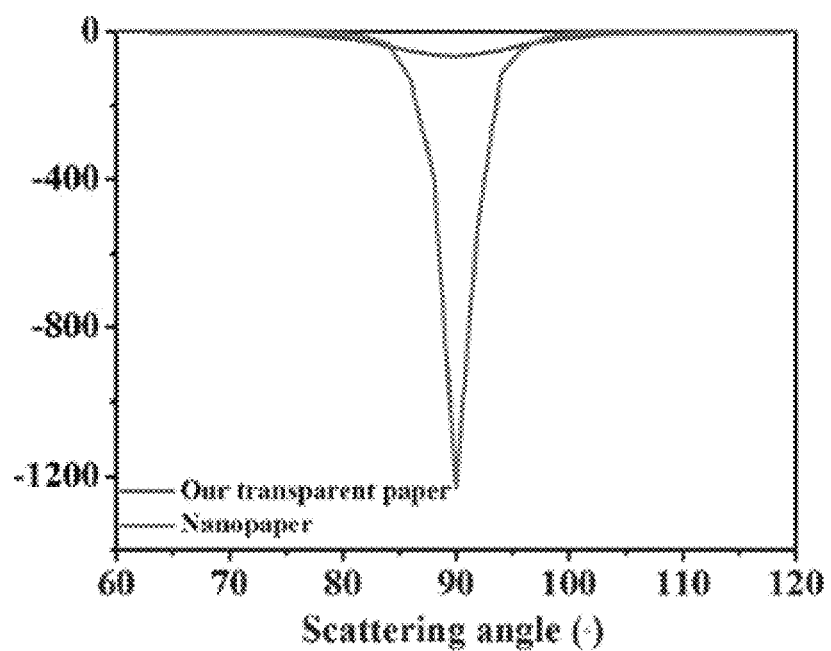
FIG. 11 shows scattering angular distribution with an arbitrary y-axis unit for transparent paper and nanopaper.
Figure 12A:
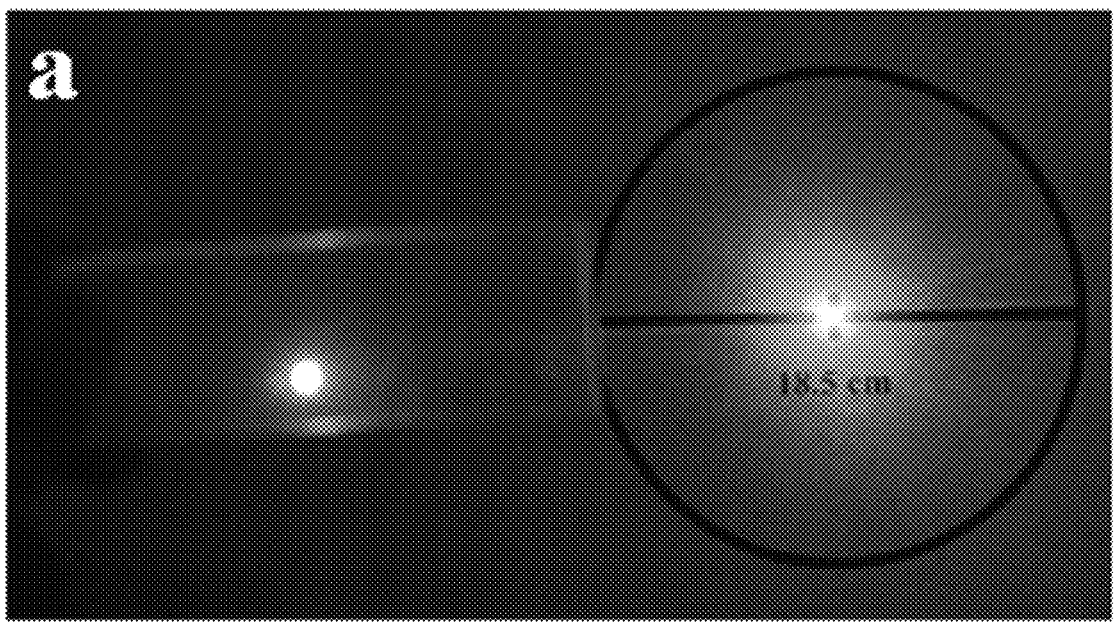
FIG. 12d shows the images to show the light scattering effect of PET when a green laser with a diameter of 0.4 cm strikes on them.
FIG. 12b shows the images to show the light scattering effect of glass when a green laser with a diameter of 0.4 cm strikes on them.
FIG. 12c shows the images to show the light scattering effect of the disclosed transparent paper when a green laser with a diameter of 0.4 cm strikes on them. The disclosed transparent paper obviously scatters light much more than PET and glass substrates.
Figure 12B:
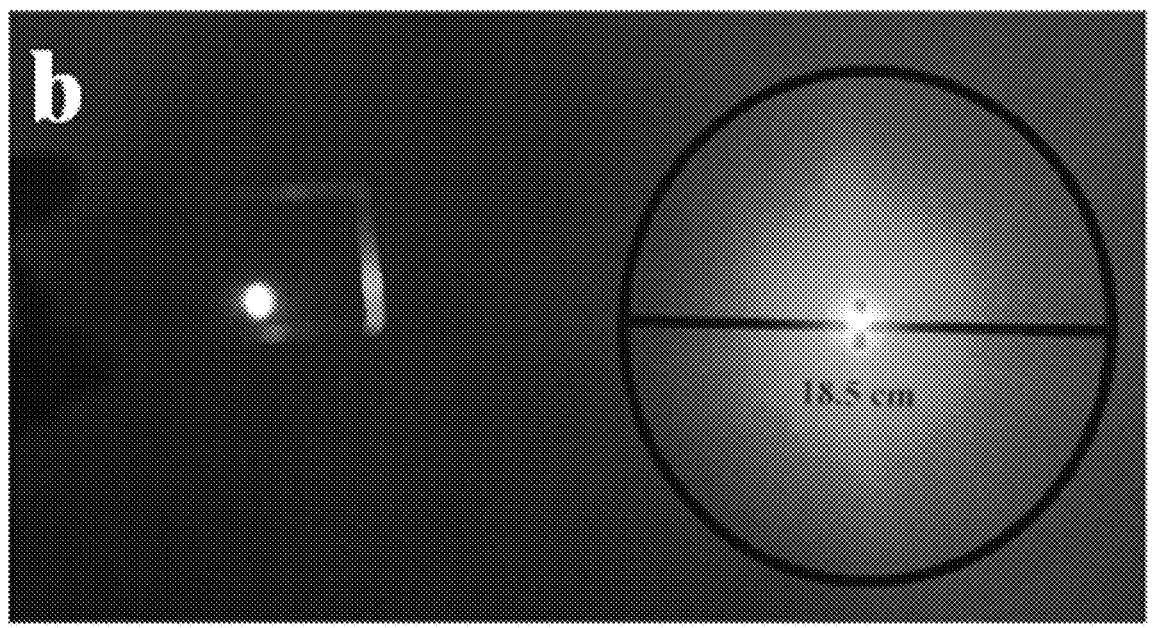
Figure 12C:
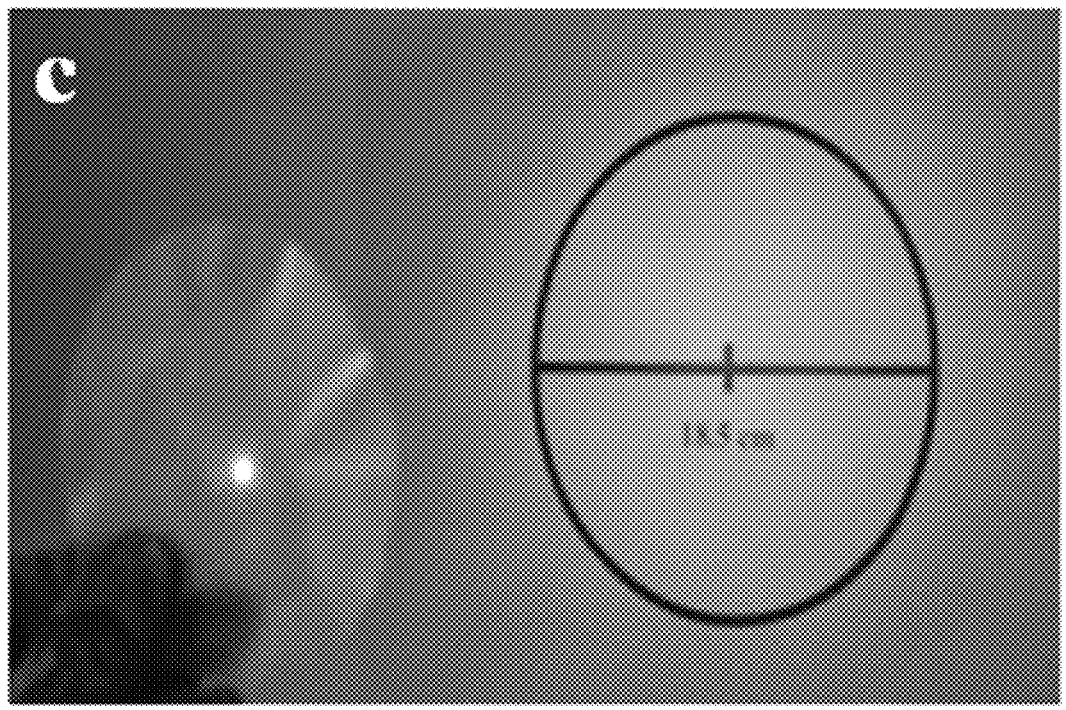

Our transparent paper delivers a maximum scattering angle of 34°. Moreover, the distribution of light transmitted through the transparent paper demonstrated in this work is quite different from nanopaper (as shown in FIG. 11), since the transmitted light has a much narrower angular distribution. The light scattering effect is also visualized in FIG. 5f (the distance between the transparent paper and target is about 30 cm). A laser with a wavelength of 532 nm and a beam diameter of 0.4 cm passes through transparent paper and forms a larger illuminated circular area on the surface of the target with a diameter of over 18.5 cm. The same experiment was also applied to glass and PET to illustrate the light scattering effect, and the results are presented in FIGS. 12a-12c. Since the transmission haze of PET and glass is lower than 1%, the transmitted light is scattered only slightly as visualized by a smaller illuminated area on the target behind the transparent paper.

Figure 5G:
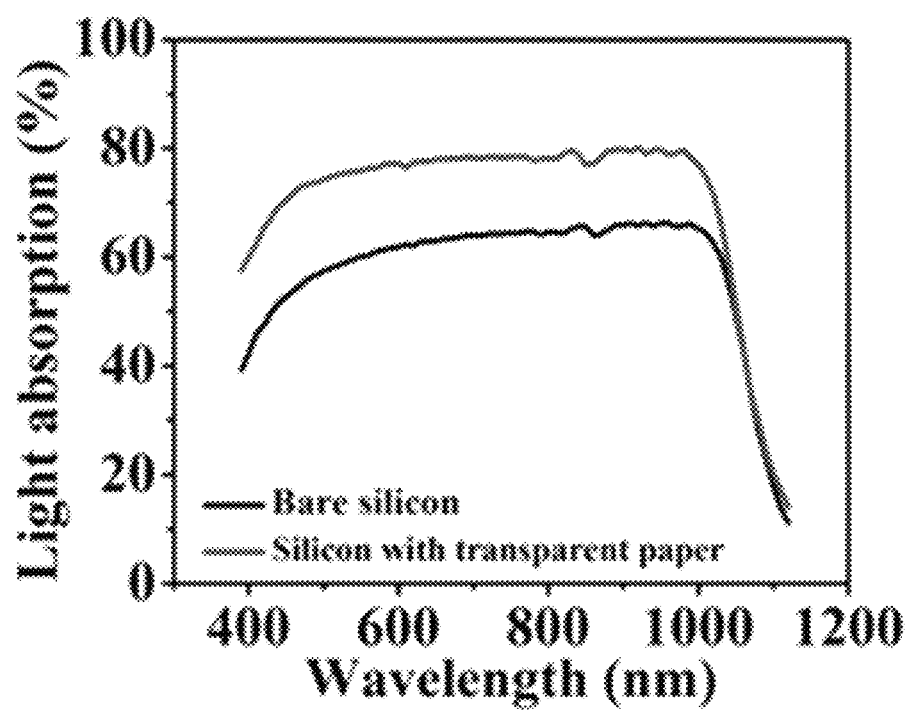
FIG. 5g shows the light absorption of transparent paper laminated on a silicon slab.
Figure 13:
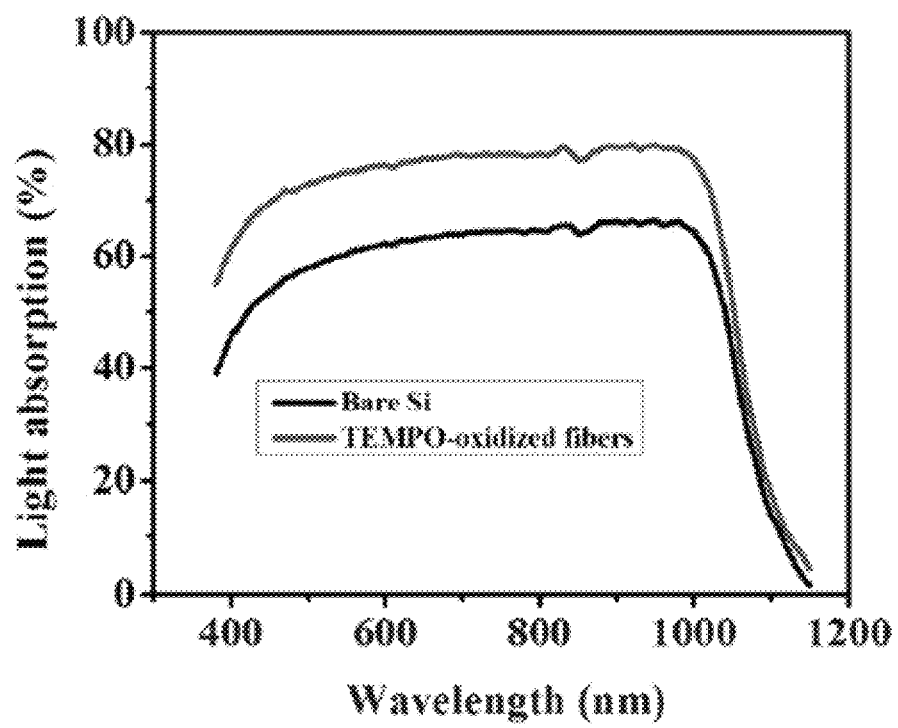
FIG. 13 shows the light absorption of TEMPO-oxidized wood fibers deposited on a silicon slab.

FIG. 5g illustrates the light absorption of transparent paper laminated on a silicon slab. The data on the light absorption of TEMPO-oxidized wood fibers deposited on silicon is very similar and is shown in FIG. 13. Compared to a bare silicon slab, there is enhanced light trapping in all the prepared samples by approximately 10-18% from 400 to 1000 nm. These results show that: (1) both TEMPO-oxidized wood fibers and transparent paper can enhance the broadband absorption efficiency of the silicon slab; (2) transparent paper or TEMPO-treated wood fibers can be applied to a silicon slab with a simple coating, dipping, or lamination that depends on the specific application desired.

Figure 6A:
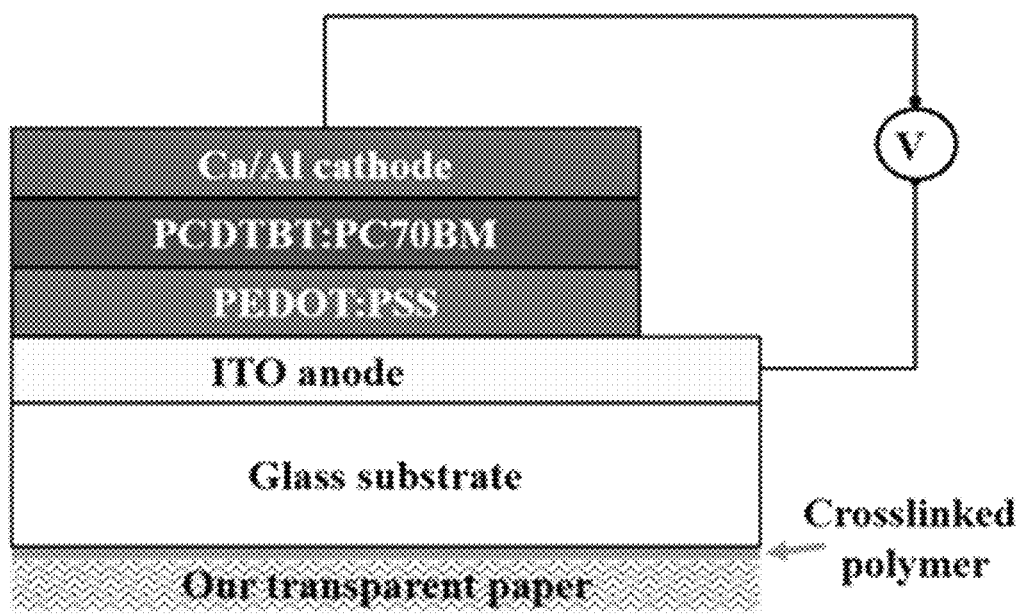
FIG. 6a shows the structure of the OPV device with transparent paper attached on the opposite glass side.
Figure 14:
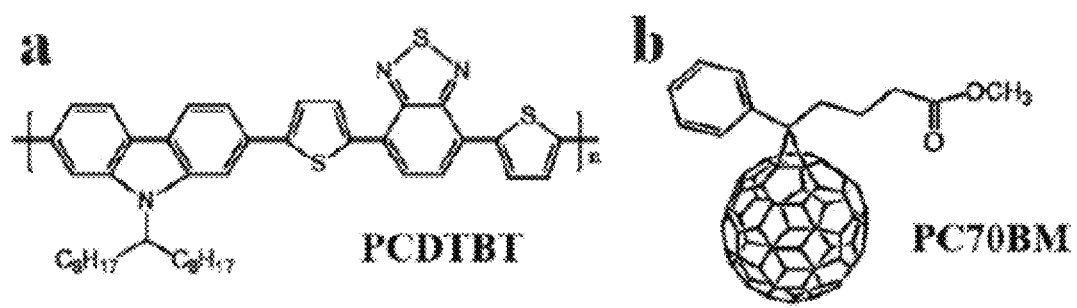
FIG. 14 shows the molecular structure of PCDTBT (a) and PC70BM (b) used in OPV devices.

FIG. 6*a* illustrates that the light harvesting of the OPV device can also be improved by simply attaching the transparent paper to the glass side of the OPV sample. On the opposite side, OPV device with a structure of indium tin oxide (ITO)/poly (3, 4-ethylenedioxythiophene)-polystyrenesulfonic acid (PEDOT-PSS)/Poly [N-9"-hepta-decanyl-2, 7-carbazole-alt-5, 5-(4', 7'-di-2-thienyl-2',1',3'-benzothiadiazole)] and [6,6]-phenyl-C 71 butyric acid methyl ester (PCDTBT:PC70BM, 90 nm)/calcium (Ca)/aluminum (Al) has been previously fabricated, and the molecular structures of the photoactive materials for the OPV device is indicated in FIG. 14.

Figure 6B:
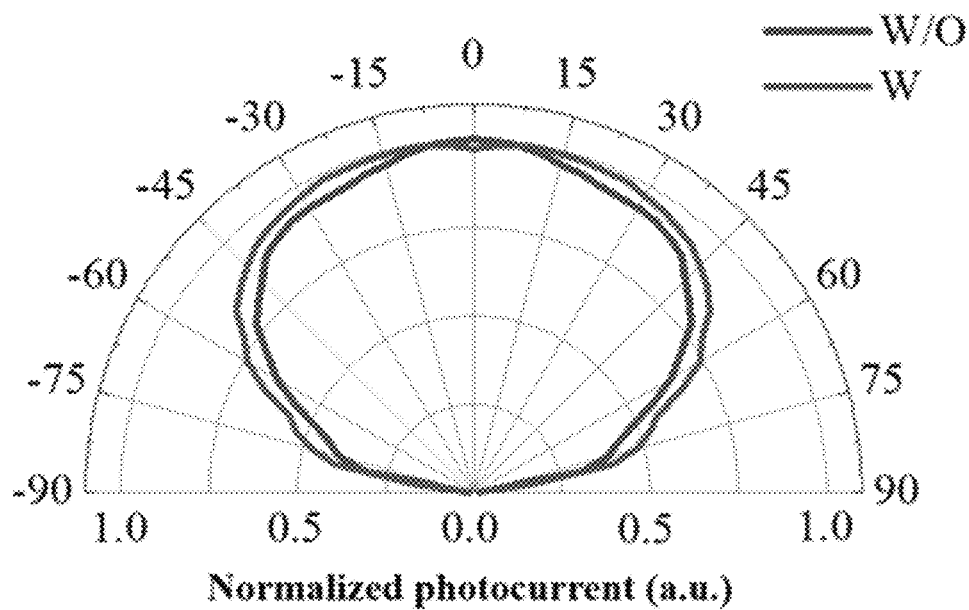
FIG. 6b shows the dependence of the photocurrent of the OPV device with or without transparent paper on the light incident angle (defined as the angle between the incident light and the normal direction of the substrate), W and W/O represent OPV device with and without transparent paper, respectively.

It is expected that the haze effect of the transparent paper causes incident angle dependent the photocurrent response. To verify this, the photocurrents of the devices under illumination from different incident angle were measured by illuminating the devices with parallel white light and rotating the devices gradually. The measured incident angle dependent photocurrents are shown in FIG. 6*b*. Here the incident angle is defined as the angle between the incident light and the normal direction of the substrate.

Figure 6C:
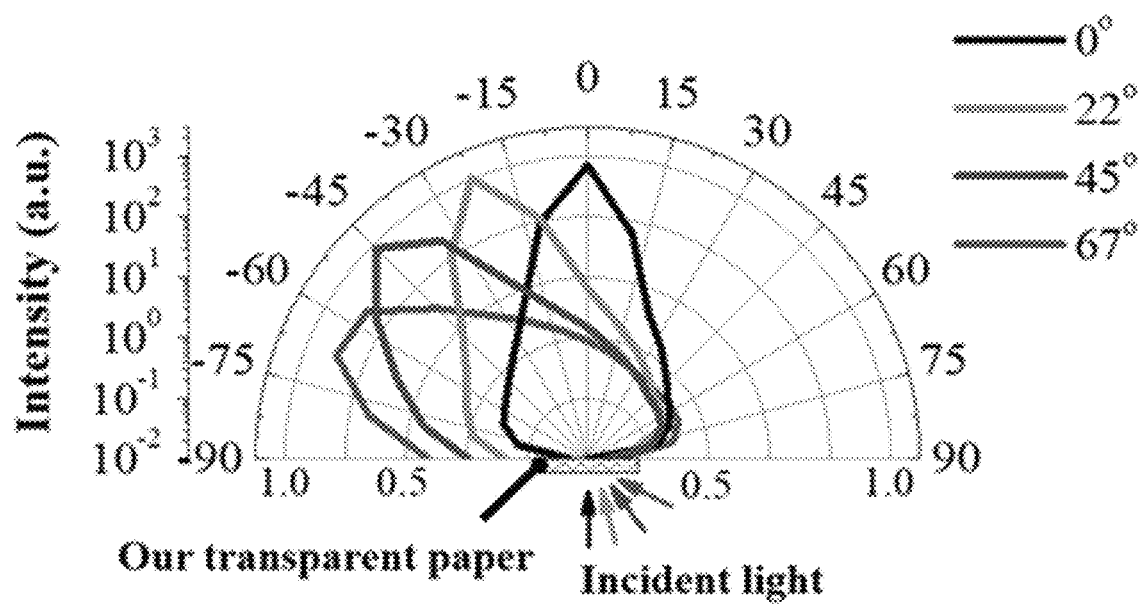
FIG. 6c shows angular distribution of the light caused by the haze effect of the transparent paper, where the light was incident at different angle.

The photocurrent has been normalized to the values obtained from the control device (without transparent paper) with light incident to the normal direction. The photocurrent of the device with transparent paper was about 3% less than that of the control device at the normal incident direction, most likely due to the roughly 90% diffusive transmittance of the transparent paper. Interestingly, the photocurrents of the device with transparent paper exceed that of the control device at a larger incident angle above 7°. A large photocurrent improvement of over 15% were observed in an incident angle range of 60°~87°. The improved photocurrent should be correlated with the reduced reflection of the light at glass surface and a broadened angular distribution of the redirected incident light caused by the transparent paper, as shown in FIG. 6*c*. Similar antireflection effects have been observed in solar cells with microstructure arrays or a textured surface. The increased light harvesting at oblique incidence indicates that the device with transparent paper can collect the ambient light more efficiently.

Figure 6D:
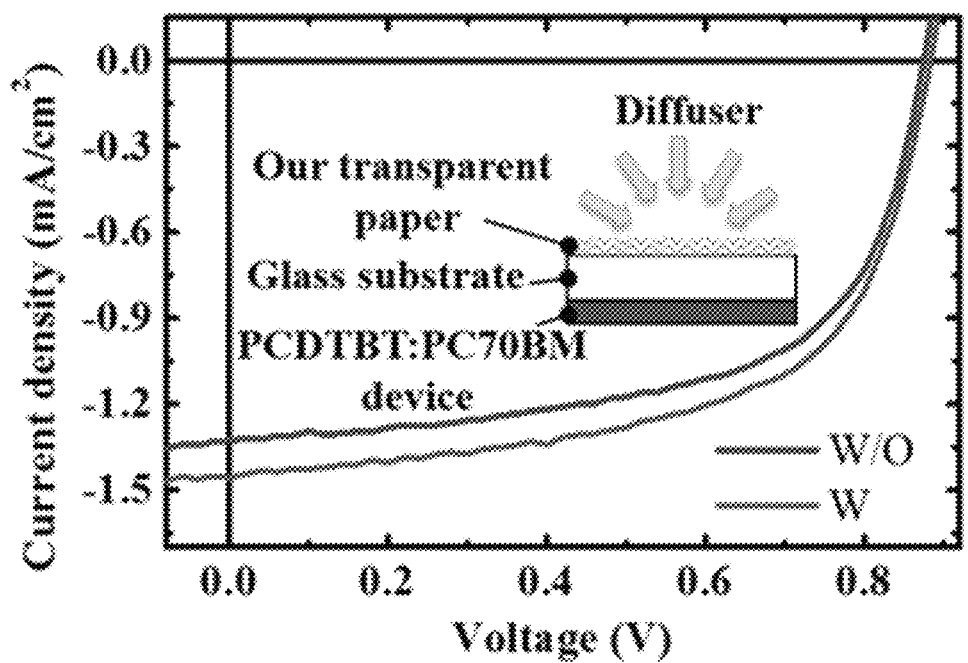
FIG. 6d shows angular of the I-V curves of the OPV device illuminated by diffused light (13 mW/cm$^2$).

FIG. 6*d* compares the PCE of the device illuminated by diffused light with an intensity of 13 mW/cm2 which further demonstrates the improved ambient light harvesting by the transparent paper. The PCE of the PCDTBT: PCBM device with transparent paper was increased from 5.34% to 5.88% due to the increased photocurrent by 10% (FIG. 6*c*). The performance improvement is attributed to better light harvesting from the diffused light since the I-V curves were obtained from the same OPV device upon attaching or after peeling off the transparent paper.

FIG. 6*d* further indicates the molecular structure of photoactive materials used in this OPV device. The increased ambient light harvesting by the transparent paper is particularly desirable for many photovoltaic applications, such as in application that cannot use mechanical light tracking systems to compensate for shift in the incident sunlight throughout the day like solar roofs, solar windows, and solar panels working in cloudy days where the sunlight is strongly scattered by the atmosphere.

EXPERIMENTAL

Bleached sulfate softwood pulp extracted from the southern yellow pine without beating or refining was treated with TEMPO-oxidized system. 5 g of wood fibers were dispersed into 1% pulp with deionized water, TEMPO and sodium bromide (NaBr) were then separately added into the wood pulp with doses of 10 wt % and 1.6 wt % based on oven-dry wood fibers, and the mixtures were finally stirred continuously for 10 min at 700 rpm to form a uniform suspension. 35 mL of sodium hypochlorite (NaClO) with a concentration of 12.5 wt % was titrated into the abovementioned suspension. The reaction time was monitored and the pH of the reaction system was kept constant at 10.5. The reaction lasted approximately 3-4 hours; however, the mixture was continuously stirred at 700 rpm for an additional 4 hours to ensure adequate reaction of the wood fibers. The dimension and morphology of the wood pulp before and after oxidization was tested using a KajaaniFS300 fiber analyzer and an optical spectroscope (OLYMPUS BX51). NFC (nanofibrillated cellulose) with a diameter of approximately 5-30 nm was extracted from the abovementioned TEMPO-oxidized wood fiber solution by homogenization with a microfluidizer.

The treated pulp was diluted to approximately 0.2 wt % in solution with deionized water. This diluted pulp was then used to fabricate transparent paper by a filtration method using a 20 cm filter membrane (0.65 µm DVPP, Millipore, U.S.A). The resulting wet film was placed between two stacks of regular paper and dried at room temperature. The optical properties of the paper were measured using a UV-Vis Spectrometer Lambda 35 containing an integrating sphere (PerkInElmer, USA).

600 µL wood fiber dispersion with a consistency of 1 wt % was coated onto a 1 cm2 silicon slab and dried at room temperature. To measure the optical properties of this sample, we built a custom optical setup. A xenon light source was used with a monochromator to select specific wavelengths from 400 nm to 1000 nm with a 10 nm step size. By comparing the amount of light entering the integrating sphere to the amount of light exiting the integrating sphere, the total absorption was measured. Two separate measurements are made: one baseline measurement with no sample in place to calibrate the system and a second measurement with the sample. By considering the difference between these two measurements, the absorptivity of the sample was calculated.

For the device fabrication, a 30 nm thick PEDOT:PSS layer was fabricated on a cleaned ITO/glass substrate by spin-coating with a rotating speed of 3,500 rpm. The spun PEDOT:PSS film was then baked at 130° C. for 15 min. PCDTBT:PC70BM dissolved in 1, 2-dichlorobenzene with a blending ratio of 1:2 (by weight) was used for the spin-coating of photoactive layer. The active layer obtained by spin-coating with a rotating speed of 2400 rpm for 20 s has a thickness of approximately 90 nm. Then the Ca/Al bilayer cathode was thermally deposited in succession. When attaching the transparent paper on the glass surface, for a better light coupling from the transparent paper to the glass, as well as strong adhesion, a cross-linked polymer (ethoxylated bisphenol A dimethacrylate mixed with 1 wt % 2,2-dimethoxy-2-phenylacetophenone56) was formed between the transparent paper and the glass substrate.

Distribution of Wood Fibers Before and after TEMPO Treatment

Figure 7A:
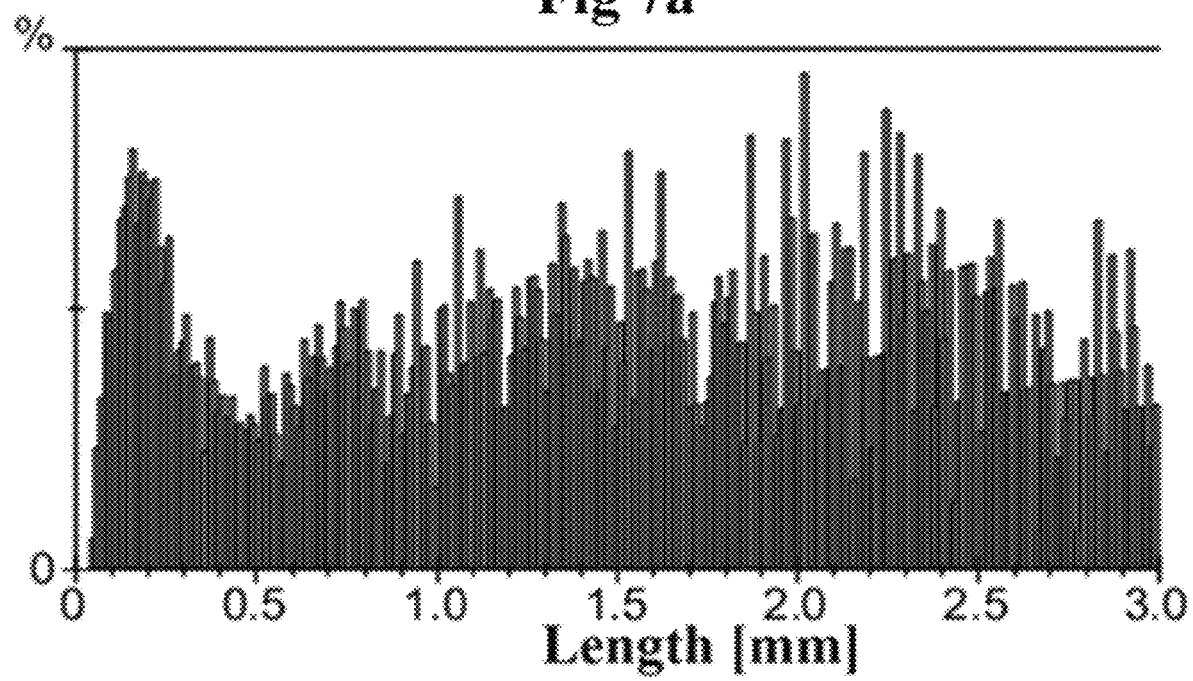
FIG. 7a shows the length distribution of original wood fibers.
Figure 7B:
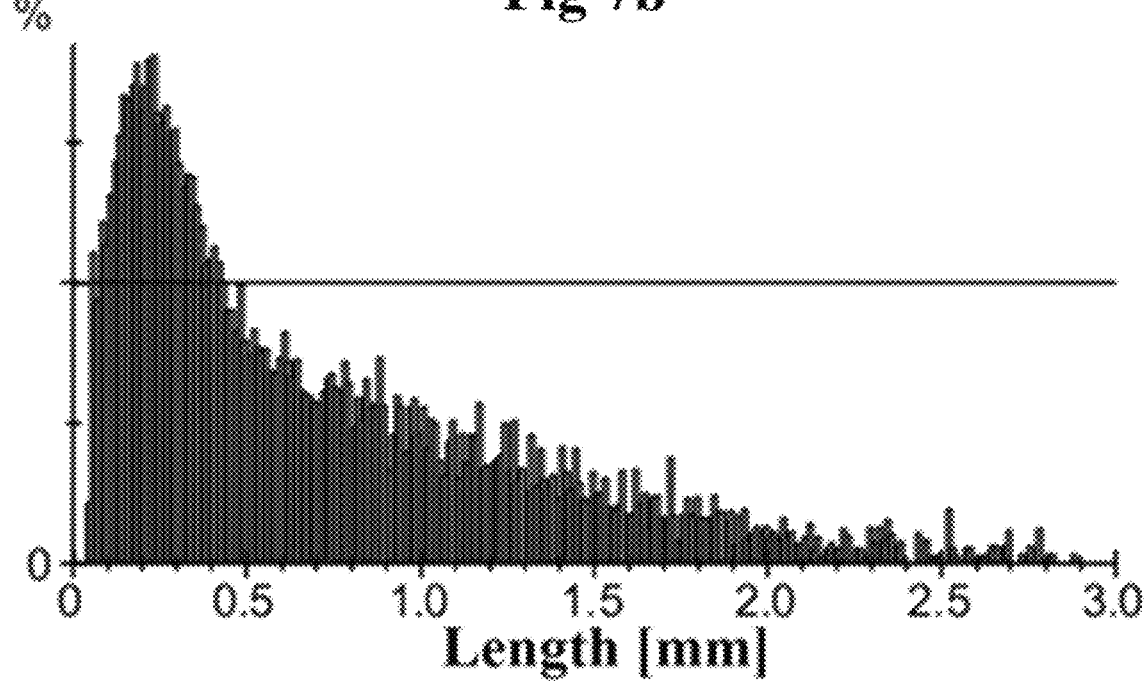
FIG. 7b shows the length distribution of TEMPO-oxidized wood fibers.

Fiber analyzer FS300 was used to investigate the distribution of fiber length and width before and after TEMPO treatment. The length distribution of original wood fibers is uniform (FIG. 7*a*), yet the length distribution of TEMPO-treated wood fibers tends to concentrate in the range of 0~1.0 mm, which indicates wood fibers are cracked into short fibers during the treatment (FIG. 7*b*).

Figure 7C:
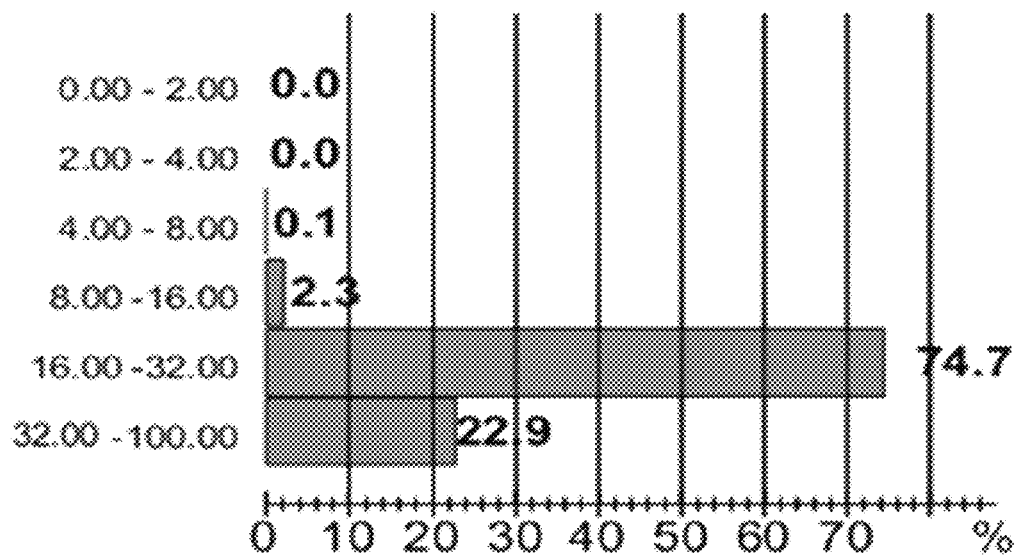
FIG. 7c shows the width distribution of original wood fibers.
Figure 7D:
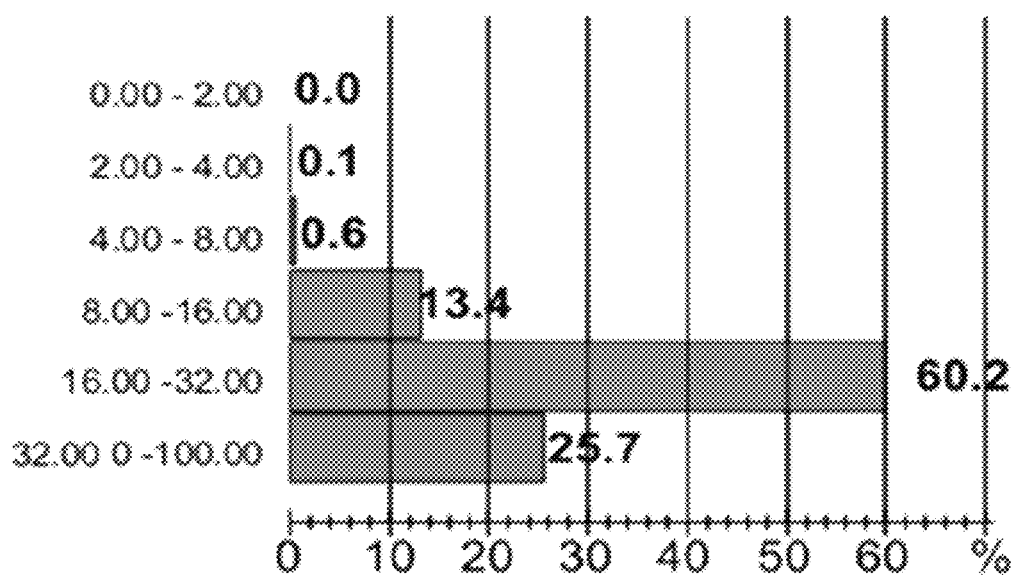
FIG. 7d shows the width distribution of TEMPO-oxidized wood fibers. The y-axis unit for FIG. 7c

FIG. 7*c* illustrates the width distribution of original wood fibers, after TEMPO system treatment, the percentage of wood fibers in the width range of 16.0–32.0 µm decreased from 74.7% to 22.9%, yet the amount of wood fibers in the width range of 8.0–16.0 µm is 6-fold more than that of original wood fibers (FIGS. 7c and 7d).

Wood Fibers after TEMPO Treatment

Figure 8A:
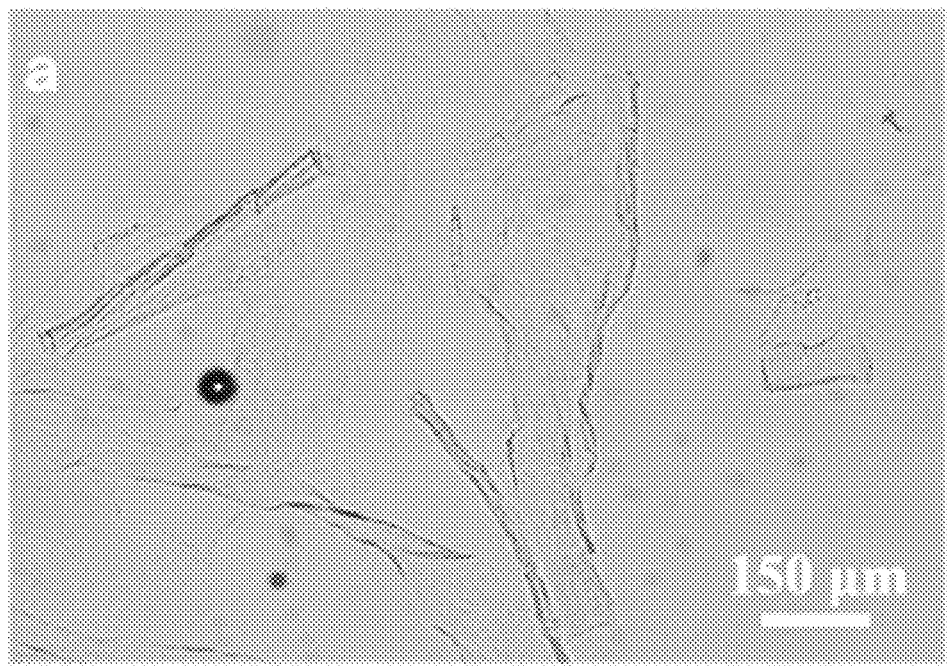
FIG. 8a shows optical microscopic picture of TEMPO-oxidized wood fiber. SEM images of crushed wood fiber.
Figure 8B:
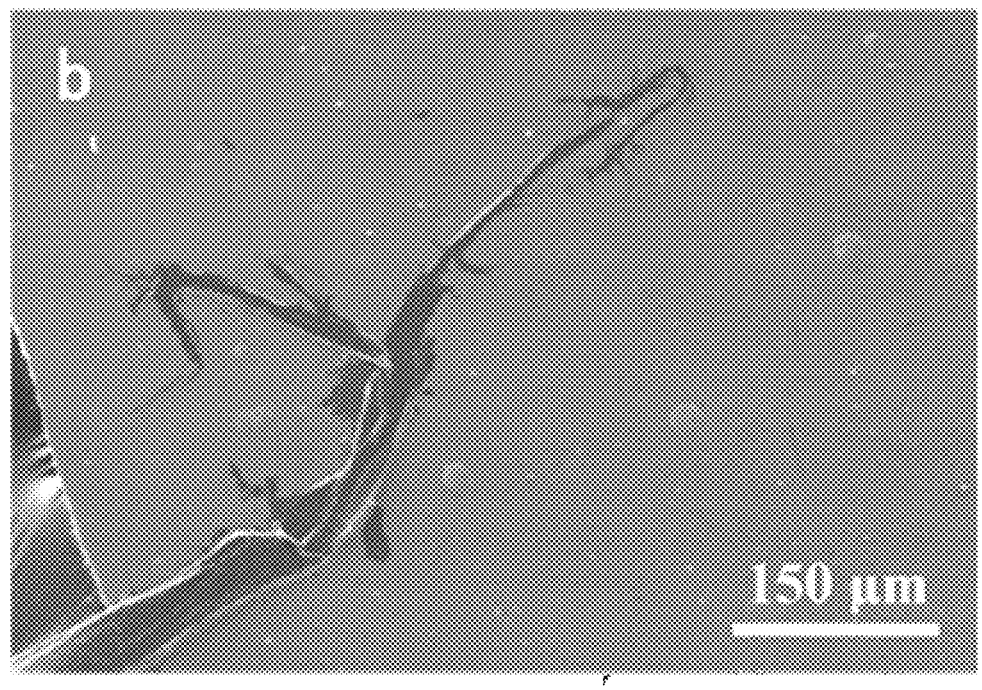
FIG. 8b shows SEM images of crushed wood fiber.
Figure 8C:
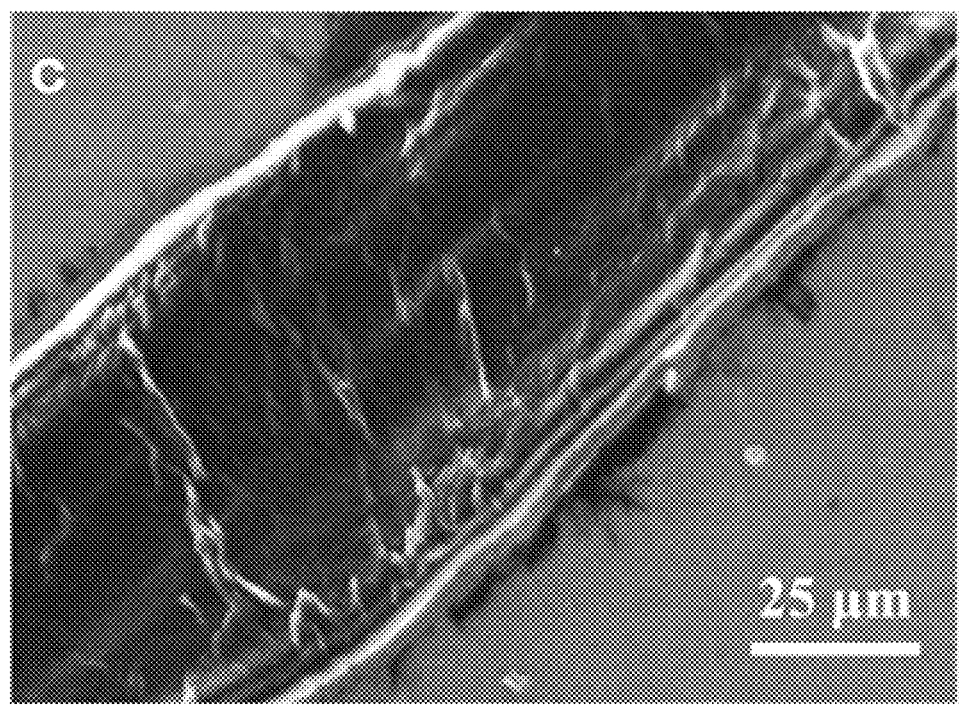
FIG. 8c shows SEM images of unzipped wood fiber.
Figure 8D:
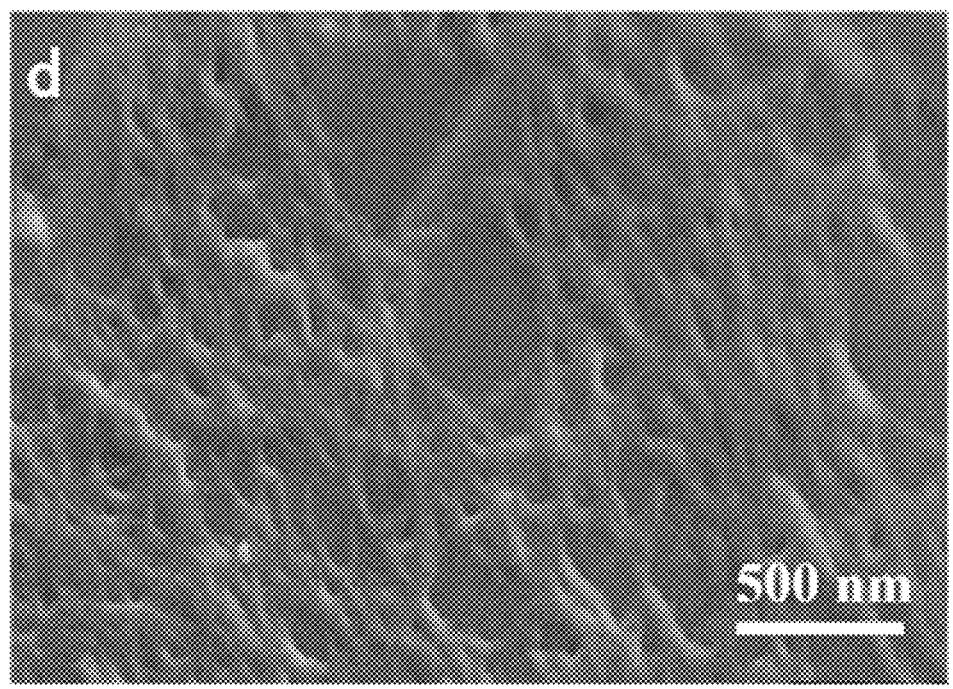
FIG. 8d shows nanofibers on the primary layer of cell wall after TEMPO treatment.

The morphological changes of wood fibers were clearly observed in FIG. 8a. After TEMPO treatment, the length of wood fibers becomes short and the cell walls of the fibers were cracked into small fragments. FIG. 8b and 8c show the wood fiber unzipped and cleaved in the axial direction that can improve the density of paper. Table S1 shows the grammage and thickness of various paper substrates for measurement of transmittance and transmission haze.

Transmittance and Haze of Paper with Different Thickness

Thickness of paper affects the transmission haze and transmittance of our transparent paper. As the thickness increases, the transmittance decreases due to an increase in to light scattering within the paper occurred (FIG. 9). Meanwhile an increase in transmission haze was observed in FIG. 3c. Table S2 demonstrates the basic weight and thickness of transparent paper.

Mechanical Modelling

To reveal the origin of the enhanced mechanical properties, we conducted molecular dynamics simulations on scaled-down models for both TEMPO-oxidized fiber and original wood fiber with roughly comparable size. Our full atomistic simulation study employs the ReaxFF potential and simulation is carried out using Large-scale Atomic/Molecular Massively Parallel Simulator (LAMMPS). ReaxFF force field was developed via first principle and is also able to account for various non-bonded interactions such as van der Waals and coulombic types, and particularly important and convenient for the present study, it has an explicit expression for hydrogen bonds.

Figure 10A:
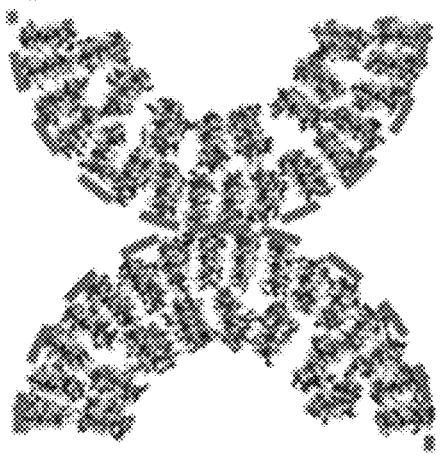
FIG. 10a shows the side view MD simulation model of inter-sliding of two original cellulose fibers.
Figure 10B:
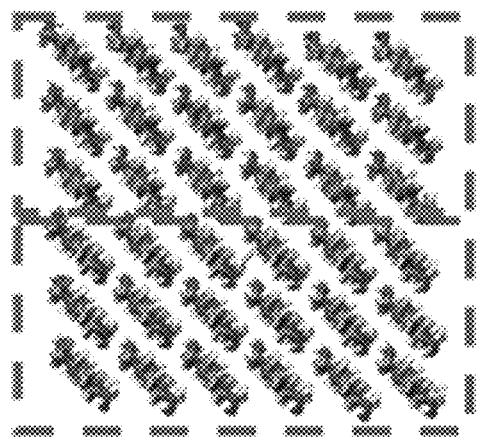
FIG. 10b shows the side view MD simulation model of two TEMPO-oxidized cellulose flakes.

FIG. 4d and FIG. 10a describes the atomistic model used to study the interaction between two original cellulose fibers. Each fiber takes a tubular structure and has the same axial length (7.8 nm) as the TEMPO-oxidized flakes in FIG. 4e and FIG. 10b but with a tube diameter of around 6 nm. FIG. 4e and FIG. 10b shows the atomistic model used to study the interaction between two TEMPO-oxidized cellulose flakes. Each flake has three layers and each layer consists of 6 TEMPO-oxidized cellulose chains. The initial stacking of those chains follows the crystalline parameters. The global size for each TEMPO-oxidized fiber is around 7.8 nm×3.9 nm×2 nm (7.8 nm is along axial direction). To reduce the computational expense, we model the two contacting halves of the neighboring hollow fibers and each half tubular fiber consists of 24 cellulose chains (with 16 chains on the outer surface). The simulations were subjected to a microcanonical (NVT) ensemble, carried out at a temperature of 5K, for the purpose of suppressing thermal noise to clearly reveal the fine feature of the hydrogen bonding stick-slip event. The time step is set to 0.5 femtoseconds (fs). The system is free to evolve for 50000 time steps until the right end of the top flake/fiber is assigned a constant axial velocity of 0.001 Å/fs, pulling the top flake/fiber to slide on the bottom flake/fiber, the left end of which is hold in position. The energy data points were sampled on every 200 time steps while the force data points were sampled on every 1000 time steps.

Although a few embodiments have been shown and described, it would be appreciated by those skilled in the art that changes may be made in this embodiment without departing from the principles and spirit of the invention, the scope of which is defined in the claims and their equivalents.

What is claimed is:

1. A product comprising:
a paper comprising a plurality of wood fibers,
wherein the paper has an optical transparency of at least 90% and an optical haze of at least 50%,
wherein the plurality of wood fibers have been subjected to a chemical treatment such that carboxyl groups are introduced into cellulose of the wood fibers,
wherein, prior to the chemical treatment, each wood fiber comprises primary and secondary cell wall layers of microfibrils surrounding a central portion, each secondary cell wall layer having microfibrils therein arranged in parallel, the microfibrils forming the secondary cell wall layers have diameters of 5-20 nm, and
wherein, after the chemical treatment, each wood fiber has a width of 8-100 µm and a length of 100 µm to 1000 µm, and the parallel arrangement of microfibrils in each secondary cell wall layer is maintained.

2. The product of claim 1, wherein after the chemical treatment, at least a portion of each wood fiber is cleaved in a direction parallel to an axis of said wood fiber such that the respective central portion is exposed from the primary and secondary cell wall layers.

3. The product of claim 1, wherein the paper comprises fines filling spaces between adjacent wood fibers, the fines being generated by the chemical treatment of the wood fibers.

4. The product of claim 3, wherein the fines comprise cellulose flakes or fragments.

5. The product of claim 1, wherein the optical haze is produced at least in part by the respective parallel arrangements of microfibrils in the secondary cell wall layers of the wood fibers.

6. The product of claim 1, further comprising:
an optical device having a first surface,
wherein the paper is disposed over the first surface such that radiation passes through the paper in traveling to or from the first surface.

7. The product of claim 6, wherein the optical device comprises a solar cell and the first surface comprises a light-receiving surface.

8. A product comprising:
a paper consisting essentially of a plurality of wood fibers and fines,
wherein the paper has an optical transparency of at least 90% and an optical haze of at least 50%,
wherein the plurality of wood fibers have been subjected to a chemical treatment such that carboxyl groups are introduced into cellulose of the wood fibers,
wherein, prior to the chemical treatment, each wood fiber comprises primary and secondary cell wall layers of microfibrils surrounding a central portion, each secondary cell wall layer having microfibrils therein arranged in parallel,
wherein, after the chemical treatment, each wood fiber has a length of 100 µm to 1000 µm and the parallel arrangement of microfibrils in each secondary cell wall layer is maintained, and
the fines fill spaces between adjacent wood fibers, the fines being generated by the chemical treatment of the wood fibers.

9. A method comprising:
(a) subjecting wood pulp in solution to a chemical treatment, the wood pulp comprising a plurality of wood fibers, the chemical treatment being such that carboxyl groups are introduced into cellulose of the wood fibers; and (b) after (a), forming the chemically-treated wood fibers into a paper having an optical transparency of at least 90% and an optical haze of at least 50%, wherein, prior to (a), each of the wood fibers in the wood pulp comprises primary and secondary cell wall layers of microfibrils surrounding a central portion, each secondary cell wall layer having microfibrils therein arranged in parallel, the microfibrils forming the secondary cell wall layer have diameters of 5-20 nm, and wherein, after (a), each of the wood fibers has width of 8-100 μm and a length of 100 μm to 1000 μm, and the parallel arrangement of microfibrils in each secondary cell wall layer is maintained.

10. The method of claim 9, wherein, in (a), the wood pulp is provided without any beating, grinding, or mechanical refining.

11. The method of claim 9, wherein the chemical treatment of (a) comprises TEMPO oxidation.

12. The method of claim 11, wherein the TEMPO oxidation includes adding NaBr and NaClO to the solution.

13. The method of claim 9, wherein (b) comprises:
(b1) segregating the wood fibers from the solution; and
(b2) pressing and drying the segregated wood fibers to form the paper.

14. The method of claim 13, wherein (b1) comprises filtering to remove the wood fibers from the solution.

15. The method of claim 9, wherein:
in (a), fines are formed, each fine comprises a cellulose flake or fragment, and
in (b), the forming is such that the fines fill spaces between adjacent wood fibers.

16. The method of claim 15, wherein the paper formed in (b) consists essentially of the plurality of wood fibers and fines.

17. The method of claim 9, wherein the paper is provided over a light-receiving surface of a solar cell such that radiation passes through the paper in traveling to or from the light-receiving surface, and further comprising using the solar cell to generate electricity from radiation passing through the paper.

18. The method of claim 9, further comprising:
after (b), passing optical radiation through the paper,
wherein scattering of the optical radiation by the respective parallel arrangements of microfibrils in the secondary cell wall layers of the wood fibers produces, at least in part, the optical haze.

19. The method of claim 9,
wherein, after (a), at least a portion of each wood fiber is cleaved in a direction parallel to an axis of said wood fiber such that the respective central portion is exposed from the primary and secondary cell wall layers.

* * * * *